US009734276B2

(12) United States Patent
Kim et al.

(10) Patent No.: US 9,734,276 B2
(45) Date of Patent: Aug. 15, 2017

(54) INTEGRATED CIRCUIT AND METHOD OF DESIGNING LAYOUT OF THE SAME

(71) Applicant: Samsung Electronics Co., Ltd., Suwon-si (KR)

(72) Inventors: Jin-tae Kim, Daejeon (KR); Chang-beom Kim, Gyeongsangnam-do (KR)

(73) Assignee: Samsung Electronics Co., Ltd. (KR)

( * ) Notice: Subject to any disclaimer, the term of this patent is extended or adjusted under 35 U.S.C. 154(b) by 5 days.

(21) Appl. No.: 14/875,910

(22) Filed: Oct. 6, 2015

(65) Prior Publication Data

US 2016/0117431 A1 Apr. 28, 2016

Related U.S. Application Data

(60) Provisional application No. 62/066,977, filed on Oct. 22, 2014.

(30) Foreign Application Priority Data

May 29, 2015 (KR) ........................ 10-2015-0076546

(51) Int. Cl.
*G06F 17/50* (2006.01)
*H01L 27/02* (2006.01)
*H01L 27/118* (2006.01)

(52) U.S. Cl.
CPC ...... *G06F 17/5072* (2013.01); *G06F 17/5081* (2013.01); *H01L 27/0207* (2013.01); *H01L 27/11807* (2013.01)

(58) Field of Classification Search
CPC ............ G06F 17/5072; G06F 17/5081; H01L 27/0207
USPC .................................................. 716/118, 119
See application file for complete search history.

(56) References Cited

U.S. PATENT DOCUMENTS

| 7,538,368 | B2 | 5/2009 | Yano |
| 7,709,301 | B2 | 5/2010 | Bosshart |
| 8,847,284 | B2 | 9/2014 | Yang et al. |
| 8,860,107 | B2 | 10/2014 | Haensch et al. |
| 8,860,148 | B2 | 10/2014 | Hu et al. |
| 2013/0200449 | A1 | 8/2013 | Chen |
| 2013/0320405 | A1 | 12/2013 | Jeon et al. |
| 2014/0239412 | A1 | 8/2014 | Yang et al. |
| 2014/0282340 | A1 | 9/2014 | Sundareswaran et al. |

*Primary Examiner* — Sun Lin
(74) *Attorney, Agent, or Firm* — Onello & Mello LLP

(57) ABSTRACT

A method of designing a layout of an integrated circuit (IC) includes: preparing a standard cell library that stores a first standard cell and a second standard cell, each of the first standard cell and the second standard cell including a plurality of conductive lines that extend in a first direction, placing the first standard cell and the second standard cell to be adjacent to each other in a first boundary parallel to the plurality of conductive lines, and generating a decoupling capacitor by using at least one first conductive line of the plurality of conductive lines when a same voltage is applied to a first pattern adjacent to the first boundary in the first standard cell and a second pattern adjacent to the first boundary in the second standard cell, the at least one first conductive line being adjacent to the first boundary.

18 Claims, 31 Drawing Sheets

INTEGRATED CIRCUIT AND METHOD OF DESIGNING LAYOUT OF THE SAME

CROSS-REFERENCE TO RELATED APPLICATIONS

This application claims the benefit of U.S. Provisional Application No. 62/066,977, filed on Oct. 22, 2014, in the US Patent Office and Korean Patent Application No. 10-2015-0076546, filed on May 29, 2015, in the Korean Intellectual Property Office, the disclosures of which are incorporated herein in their entireties by reference.

BACKGROUND

Inventive concepts relate to an integrated circuit (IC), and more particularly, to an IC including at least one standard cell and a method of designing a layout of the same.

Designing a semiconductor integrated circuit (IC) involves a process of converting a behavioral model of a chip, which describes an operation to be performed in a semiconductor system, into a specific structure model that describes connections between chip components. When a library is generated with respect to cells included in the semiconductor IC and the semiconductor IC is implemented using the library, the time and cost needed to design and implement the semiconductor IC may be reduced.

SUMMARY

In exemplary embodiments in accordance with principles of inventive concepts, there is provided a method of designing a layout of an integrated circuit (IC), including: preparing a standard cell library that stores first and second standard cells, each of the first and second standard cells including a plurality of conductive lines that extend in a first direction; placing the first and second standard cells to be adjacent to each other at a first boundary parallel to the plurality of conductive lines; and generating a decoupling capacitor by using at least one first conductive line of the plurality of conductive lines when a same voltage is applied to a first pattern adjacent to the first boundary in the first standard cell and a second pattern adjacent to the first boundary in the second standard cell, the at least one first conductive lines being adjacent to the first boundary.

In exemplary embodiments in accordance with principles of inventive concepts, there is provided an IC including: a first standard cell that includes a first pattern adjacent to a first boundary, and a second standard cell that includes a second pattern adjacent to the first boundary and is placed adjacent to the first standard cell, wherein when a same voltage is applied to the first and second patterns, a decoupling capacitor is generated by using at least one first conductive line between the first pattern and the second pattern and the first and second patterns, the at least one first conductive line being disposed in parallel to the first boundary and extending in a first direction.

In exemplary embodiments in accordance with principles of inventive concepts, there is provided a semiconductor device manufactured using an IC including first and second standard cells adjacent to each other at a first boundary of a first direction, the semiconductor device including: a substrate that includes active regions continuously disposed in a second direction substantially perpendicular to the first direction, a plurality of fins on the substrate; gate electrodes disposed to extend in the first direction on the plurality of fins, and first and second contacts that are disposed on some of the plurality of fins, the first contact being adjacent to the first boundary in the first cell, and the second contact being adjacent to the first boundary in the second cell, wherein when a same voltage is applied to the first and second contacts, a decoupling capacitor is generated by using at least one first gate electrode of the gate electrodes between the first contact and the second contact and the first and second contacts.

In exemplary embodiments in accordance with principles of inventive concepts, a method of designing a layout of an integrated circuit (IC) in an electronic processor includes a processor preparing a standard cell library that stores first and second standard cells, each of the first and second standard cells including a plurality of conductive lines that extend in a first direction; the processor placing the first and second standard cells to be adjacent to each other at a first boundary parallel to the plurality of conductive lines; and the processor generating a decoupling capacitor by using at least one first conductive line of the plurality of conductive lines when a same voltage is to be applied to a first pattern adjacent to the first boundary in the first standard cell and to a second pattern adjacent to the first boundary in the second standard cell, the at least one first conductive line being adjacent to the first boundary.

In exemplary embodiments in accordance with principles of inventive concepts, the at least one first conductive line is disposed on the first boundary.

In exemplary embodiments in accordance with principles of inventive concepts a method includes insulating the first standard cell from the second standard cell by using the at least one first conductive line as a dummy line when different voltages are to be applied to the first and second patterns.

In exemplary embodiments in accordance with principles of inventive concepts a method includes at least one of the first and second standard cells includes a cutting layer disposed on the first boundary, the cutting layer being configured to insulate the first standard cell from the second standard cell; and the generating of the decoupling capacitor further comprises removing the cutting layer between the first pattern and the second pattern to generate the decoupling capacitor when the same voltage is to be applied to the first and second patterns.

In exemplary embodiments in accordance with principles of inventive concepts a method includes the first standard cell further includes first fins that extend in a second direction substantially perpendicular to the first direction; the second standard cell further includes second fins that extend in the second direction; and the cutting layer is disposed to insulate the first fins included in the first standard cell from the second fins included in the second standard cell.

In exemplary embodiments in accordance with principles of inventive concepts a method includes the first pattern is a first contact pattern disposed on some of the first fins; the second pattern is a second contact pattern disposed on some of the second fins; and a first contact fin of the first fins, a second contact fin of the second fins, and the at least one first conductive line implement a transistor corresponding to the decoupling capacitor, the first and second contact fins being respectively connected to the first and second contact patterns.

In exemplary embodiments in accordance with principles of inventive concepts a method includes maintaining the cutting layer between the first pattern and the second pattern such that the first conductive line becomes a dummy line when different voltages are to be applied to the first and second patterns.

In exemplary embodiments in accordance with principles of inventive concepts a method includes at least one of the first and second standard cells further includes an additive cutting layer disposed on a second boundary opposite to the first boundary.

In exemplary embodiments in accordance with principles of inventive concepts a method includes generating a cutting layer between the first pattern and the second pattern after the placing of the first and second standard cells when different voltages are to be applied to the first and second patterns, the cutting layer being configured to insulate the first standard cell from the second standard cell.

In exemplary embodiments in accordance with principles of inventive concepts a method includes the first standard cell further includes first fins that extend in a second direction substantially perpendicular to the first direction; the second standard cell further includes second fins that extend in the second direction; and the cutting layer is disposed to insulate the first fins included in the first standard cell from the second fins included in the second standard cell.

In exemplary embodiments in accordance with principles of inventive concepts a method includes the first pattern is a first contact pattern disposed on some of the first fins; the second pattern is a second contact pattern disposed on some of the second fins; and a first contact fin of the first fins, a second contact fin of the second fins, and the at least one first conductive line implement a transistor corresponding to the decoupling capacitor, the first and second contact fins being respectively connected to the first and second contact patterns.

In exemplary embodiments in accordance with principles of inventive concepts a method includes generating an additive cutting layer disposed on a second boundary opposite to the first boundary with respect to at least one of the first and secondary patterns after the placing of the first and second standard cells.

In exemplary embodiments in accordance with principles of inventive concepts a method includes the same voltage applied to the first and second patterns is a power supply voltage or a ground voltage.

In exemplary embodiments in accordance with principles of inventive concepts a method includes the plurality of conductive lines correspond to a plurality of gate electrodes.

In exemplary embodiments in accordance with principles of inventive concepts a method includes designing the IC such that the first conductive line floats.

In exemplary embodiments in accordance with principles of inventive concepts an integrated circuit includes a first standard cell that includes a first pattern adjacent to a first boundary; and a second standard cell that includes a second pattern adjacent to the first boundary and is adjacent to the first standard cell, wherein when a same voltage is to be applied to the first and second patterns, a decoupling capacitor includes the first and second patterns and at least one first conductive line between the first pattern and the second pattern, the at least one first conductive line being disposed in parallel to the first boundary and extending in a first direction.

In exemplary embodiments in accordance with principles of inventive concepts when different voltages are to be applied to the first and second patters, a cutting layer is disposed between the first standard cell and the second standard cell, the cutting layer being configured to insulate the first standard cell from the second standard cell.

In exemplary embodiments in accordance with principles of inventive concepts the first standard cell further includes first fins that extend in a second direction substantially perpendicular to the first direction; the second standard cell further includes second fins that extend in the second direction; and the cutting layer is disposed to insulate the first fins included in the first standard cell from the second fins included in the second standard cell.

In exemplary embodiments in accordance with principles of inventive concepts the first pattern is a first contact pattern disposed on some of the first fins; the second pattern is a second contact pattern disposed on some of the second fins; and a first contact fin of the first fins, a second contact fin of the second fins, and the at least one first conductive line implement a transistor corresponding to the decoupling capacitor, the first and second contact fins being respectively connected to the first and second contact patterns.

In exemplary embodiments in accordance with principles of inventive concepts at least one of the first and second standard cells further includes an additive cutting layer disposed on a second boundary opposite to the first boundary.

In exemplary embodiments in accordance with principles of inventive concepts the same voltage to be applied to the first and second patterns is a power supply voltage or a ground voltage.

In exemplary embodiments in accordance with principles of inventive concepts the at least one first conductive line corresponds to a gate electrode.

In exemplary embodiments in accordance with principles of inventive concepts the at least one first conductive line floats.

In exemplary embodiments in accordance with principles of inventive concepts a semiconductor device manufactured using an IC including first and second standard cells adjacent to each other in a first boundary of a first direction, the semiconductor device includes a substrate that includes active regions continuously disposed in a second direction substantially perpendicular to the first direction; a plurality of fins on the substrate; gate electrodes disposed to extend in the first direction on the plurality of fins; and first and second contacts that are disposed on some of the plurality of fins, the first contact being adjacent to the first boundary in the first cell, and the second contact being adjacent to the first boundary in the second cell, wherein when a same voltage is to be applied to the first and second contacts, a decoupling capacitor includes the first and second contacts and at least one first gate electrode of the gate electrodes between the first contact and the second contact.

In exemplary embodiments in accordance with principles of inventive concepts when different voltages are to be applied to the first and second contacts, the at least one first gate electrode operates as a dummy gate, and the first standard cell is insulated from the second standard cell.

In exemplary embodiments in accordance with principles of inventive concepts a first fin of the plurality of fins, a second fin of the plurality of fins, and the at least one first gate electrode implement a transistor corresponding to the decoupling capacitor, the first and second fins being respectively connected to the first and second contacts.

In exemplary embodiments in accordance with principles of inventive concepts the same voltage to be applied to the first and second contacts is a power supply voltage or a ground voltage.

In exemplary embodiments in accordance with principles of inventive concepts a method of designing an integrated circuit using a design tool that includes a processor includes the processor selecting first and second standard cells from a standard cell library and placing them adjacent one another, wherein the first and second standard cells include conductive lines adjacent and parallel to a boundary formed between the two cells by their adjacent placement and contact patterns parallel to the boundary; the processor determining whether, according to the integrated circuit design, the same voltage is to be applied to contact patterns in each standard cell; and the processor forming a decoupling capacitor by using the conductive lines when the same voltage is to be applied to the contact patterns in each cell.

In exemplary embodiments in accordance with principles of inventive concepts a method of designing an integrated circuit using a design tool that includes a processor includes the processor designs the contact patterns to be connected to a power supply voltage.

In exemplary embodiments in accordance with principles of inventive concepts a method of designing an integrated circuit using a design tool that includes a processor includes the processor designs the contact patterns to be connected to a ground.

In exemplary embodiments in accordance with principles of inventive concepts a method of designing an integrated circuit using a design tool that includes a processor includes the active regions are source drain regions.

BRIEF DESCRIPTION OF THE DRAWINGS

Exemplary embodiments of inventive concepts will be more clearly understood from the following detailed description taken in conjunction with the accompanying drawings in which.

DETAILED DESCRIPTION OF THE EMBODIMENTS

Figure 1:
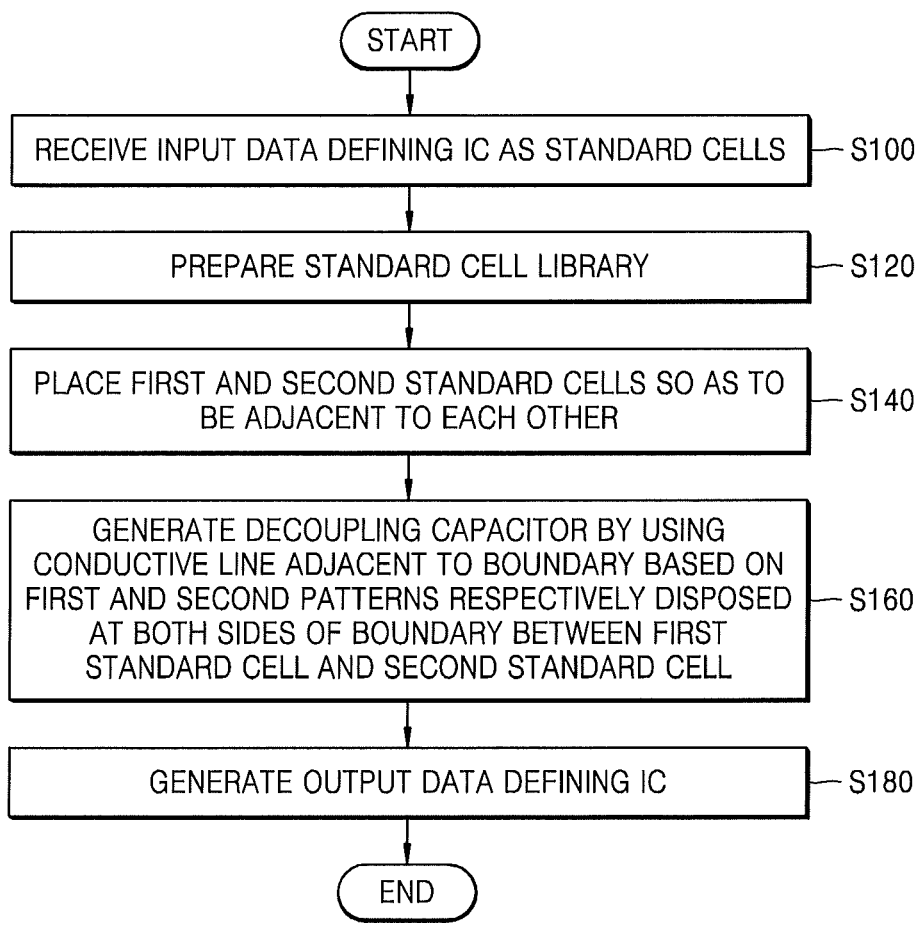
FIG. 1 is a flowchart of a method of designing an integrated circuit (IC), according to an exemplary embodiment.

Embodiments of inventive concepts will be described more fully hereinafter with reference to the accompanying drawings, in which embodiments of the inventive concepts are shown. Inventive concepts may, however, be embodied in many different forms and should not be construed as limited to the embodiments set forth herein. Rather, exemplary embodiments are provided so that this disclosure will be thorough and complete, and will fully convey the scope of inventive concepts to those skilled in the art.

Accordingly, known processes, elements, and techniques are not described with respect to some of the embodiments of inventive concepts. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of inventive concepts.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a flowchart of an exemplary method of designing an integrated circuit (IC) in accordance with principles of inventive concepts.

Referring to FIG. 1, the method of designing the IC may include a method of designing a layout of the IC. The method may be performed using an IC design tool, which may include a plurality of commands executed in a processor.

In operation S100, input data may be received. The input data may define the IC using standard cells. Generally, the IC may be defined as a plurality of cells. Specifically, the IC may be designed by using a cell library including feature information about the plurality of cells. In exemplary embodiments described below, a cell may be a standard cell and a cell library may be a standard cell library.

The term "standard cell" may refer to a unit of an IC in which a size of the layout meets a preset rule. The standard cell may include an input 引脚 and an output 引脚 and may process a signal received through the input 引脚, and output a signal through the output 引脚. For example, the standard cell may correspond to a basic cell such as an AND, an OR, a NOR, or an inverter, a complex cell such as an OR/AND/INVERTER (OAI) or an AND/OR/INVERTER (AOI), and a storage element such as a master-slave flip flop or a latch.

In exemplary embodiments, input data may be data generated from an abstractive form with respect to behavior of the IC, for example, data defined in a register transfer level (RTL), through synthesis using the standard cell library. For example, the input data may be a bitstream or a netlist that is generated by synthesizing the ICs defined by a hardware description language (HDL) such as VHSIC hardware description language (VHDL) or Verilog.

In exemplary embodiments, input data may be data for defining the layout of the IC. For example, the input data may include geometric information for defining a structure implemented as a semiconductor material, a metal, and an insulator. The layer of the IC indicated by the input data may have a layout of the standard cells and conducting wires used to connect a standard cell to other standard cells, for example.

In operation S120, the standard cell library may be prepared. The standard cell library may include information about a plurality of standard cells. For example, the standard cell library may include a name and a function of the standard cell, timing information, power information, and layout information. The standard cell library may be stored in a storage. In operation S120, the standard cell library may be prepared by accessing the storage.

In operation S140, a first standard cell and a second standard cell may be placed adjacent to one another. The first and second standard cells may correspond to information included in the standard cell library; that is, they may be cells from the standard cell library. Operation S140 may be performed by a placement tool. Specifically, the placement tool may acquire the first and second standard cells from the standard cell library based on the received input data and may dispose the first and second standard cells in one direction to be adjacent to each other.

In operation S160, a decoupling capacitor may be generated by using at least one conductive line adjacent to a first boundary based on voltages of first and second patterns respectively disposed at both sides of the first boundary between the first standard cell and the second standard cell. In exemplary embodiments in accordance with principles of inventive concepts, when the same voltage is applied to the first and second patterns, the decoupling capacitor may be generated by using the at least one conductive line and the first and second patterns. In exemplary embodiments in accordance with principles of inventive concepts, because a decoupling capacitor is generated in this manner, it is not necessary to additionally dispose a decoupling capacitor cell in order to reduce voltage noise in the IC, and, as a result, an increase in an area of the IC may thereby be prevented.

In exemplary embodiments, the first and second standard cells may be placed adjacent to each other at the first boundary. In exemplary embodiments, the first and second standard cells may be placed to come into contact with each other at the first boundary. In another exemplary embodiment, at least one of the first and second standard cells may be spaced a predetermined distance apart from the first boundary.

Figure 5:
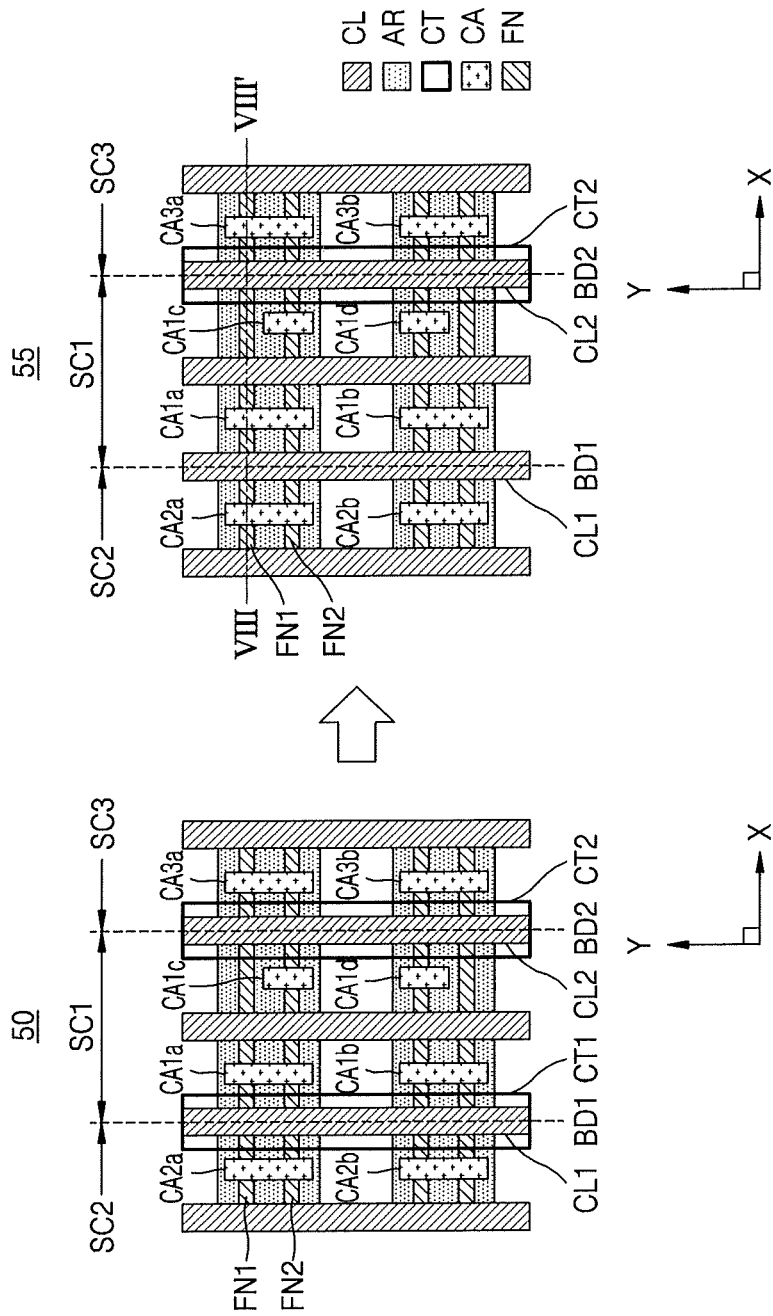
FIG. 5 is a layout to which the method of FIG. 4 is applied, according to an exemplary embodiment.
Figure 16:
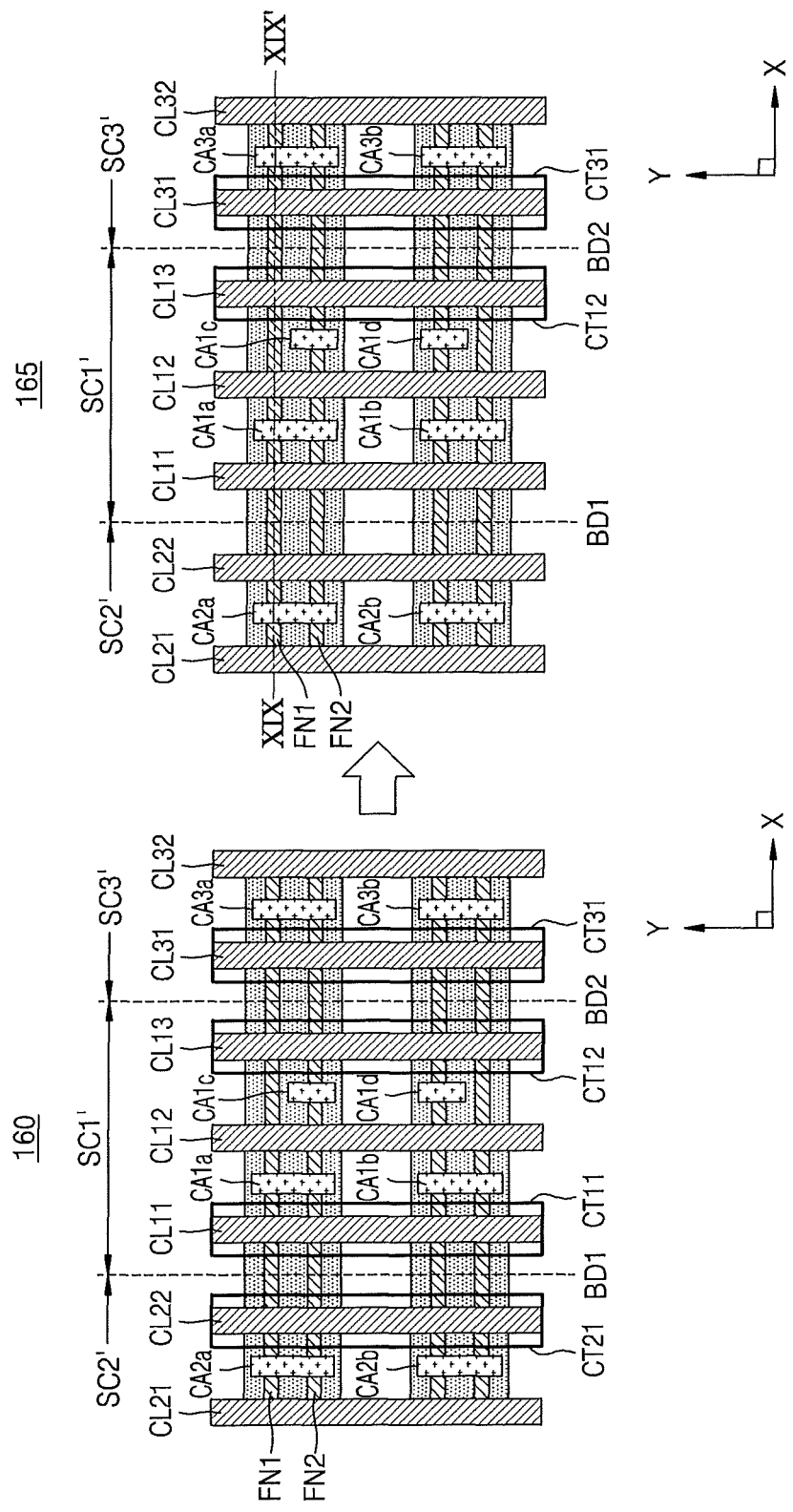
FIG. 16 is a layout to which the method of FIG. 4 is applied, according to another exemplary embodiment.

In exemplary embodiments, the at least one conductive line may be disposed on the first boundary. For example, the at least one conductive line may be disposed as illustrated in FIG. 5. More detailed descriptions thereof will be provided with reference to FIG. 5. In other exemplary embodiments, the at least one conductive line may be spaced a predetermined distance apart from the first boundary. For example, the at least one conductive line may be disposed as illustrated in FIG. 16. More detailed descriptions thereof will be provided with reference to FIG. 16.

In exemplary embodiments, the number of the conductive lines may adaptively be determined according to the decoupling capacitance necessary for the IC. For example, as the decoupling capacitance necessary for the IC increases, the number of the conductive lines may increase to form the decoupling capacitor between the first standard cell and the second standard cell. In another exemplary embodiment, the number of the conductive lines may be maintained constant. The number of decoupling capacitors may adaptively be determined in the IC. For example, as the decoupling capacitance necessary for the IC increases, the number of decoupling capacitors may increase.

In exemplary embodiments, the first pattern may be disposed relatively adjacent to the first boundary in the first standard cell. In exemplary embodiments, the first standard cell may include a plurality of first patterns disposed relatively adjacent to the first boundary. For example, the first patterns may be patterns CA1*a* and CA1*b* included in a first standard cell SC1 of FIG. 5. In exemplary embodiments, the first pattern may be a contact pattern for applying a voltage to an active region or an active fin in the first standard cell, for example.

In exemplary embodiments, the second pattern may be disposed relatively adjacent to the first boundary in the second standard cell. In exemplary embodiments, the second standard cell may include a plurality of second patterns disposed relatively adjacent to the first boundary. For example, the second patterns may be patterns CA2*a* and CA2*b* included in a second standard cell SC2 of FIG. 5. In exemplary embodiments, the second pattern may be a contact pattern for applying a voltage to an active region or an active fin in the second standard cell.

In operation S180, the output data defining the IC may be outputted. In exemplary embodiments, when the received input data is data such as the bitstream or the netlist generated by synthesizing the ICs, the output data may be the bitstream or the netlist. In another exemplary embodiment, when the received input data is data defining the layout of the IC, the data having a graphic data system II (GDSII) format, a format of the output data may also be data defining the layout of the IC.

Figure 2:
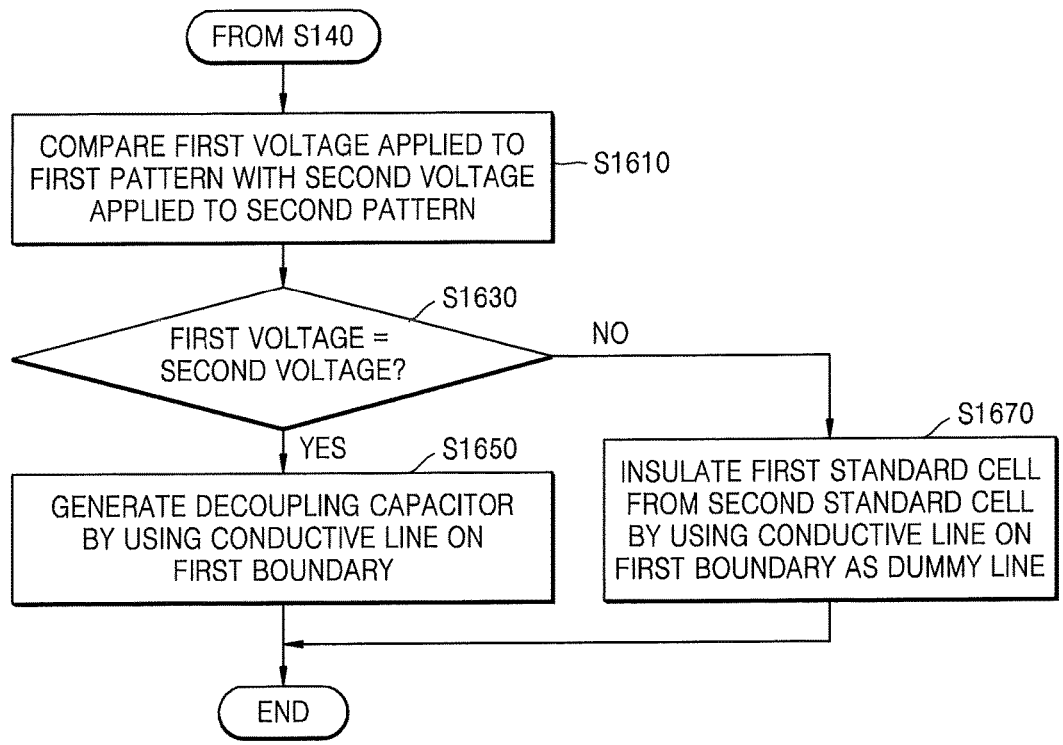
FIG. 2 is a flowchart of an operation of generating a decoupling capacitor in the method of FIG. 1, according to an exemplary embodiment.

FIG. 2 is a flowchart of an exemplary method of generating a decoupling capacitor in the method of FIG. 1 in accordance with principles of inventive concepts.

Referring to FIG. 2, in operation S1610, a first voltage to be applied to the first pattern may be compared with a second voltage to be applied to the second pattern. In exemplary embodiments, the first pattern may be the contact pattern for applying a voltage to the active region or the active fin in the first standard cell. The voltage to be applied to the first pattern may be referred to herein as the first voltage. The second pattern may be the contact pattern for applying a voltage to the active region or the active fin in the second standard cell. The voltage to be applied to the second pattern may be referred to herein as the second voltage.

In operation S1630, it is determined whether the first voltage is substantially the same as the second voltage. As a result of the determination, when the first voltage is substantially the same as the second voltage, operation S1650 may be performed. On the other hand, when the first voltage is not substantially the same as the second voltage, operation S1670 may be performed.

In operation S1650, in accordance with principles of inventive concepts, the decoupling capacitor may be generated using the at least one conductive line on the first boundary. In exemplary embodiments, the first and second patterns and the at least one conductive pattern on the first boundary may implement a transistor corresponding to the decoupling capacitor. The same voltage may be applied to the first and second patterns. In exemplary embodiments, the at least one conductive line may float. In another exemplary embodiment, the at least one conductive line may be biased by a predetermined voltage. However, inventive concepts are not limited thereto. In another exemplary embodiment, the decoupling capacitor may be generated by using at least one conductive line spaced a predetermined distance apart from the first boundary.

In operation S1670, the first standard cell may be insulated from the second standard cell by using the at least one conductive line on the first boundary as a dummy line. In exemplary embodiments, in order to electrically insulate the first standard cell from the second standard cell, a cutting layer may be disposed between the first standard cell and the second standard cell. That is, the layout of the IC including the first and second standard cells may include the cutting layer between the first standard cell and the second standard cell.

The cutting layer may be a marking layer for cutting a predetermined region between the first standard cell and the second standard cell. For example, the cutting layer may be a marking layer for cutting fins adjacent to each other in the first and second standard cells. In a semiconductor device manufactured according to the layout including the cutting layer, the fins included in the first standard cell may be separated from the fins included in the second standard cell. In this manner, the first standard cell may be electrically insulated from the second standard cell.

The cutting layer may be referred to as a diffusion break. For example, when the cutting layer is disposed with respect to one dummy line (for example, a dummy gate) between the first standard cell and the second standard cell, the cutting layer may be referred to as a single diffusion break (SDB) and when the cutting layer is disposed with respect to two dummy lines (for example, dummy gates) between the first standard cell and the second standard cell, the cutting layer may be referred to as a double diffusion break (DDB).

Figure 3A:
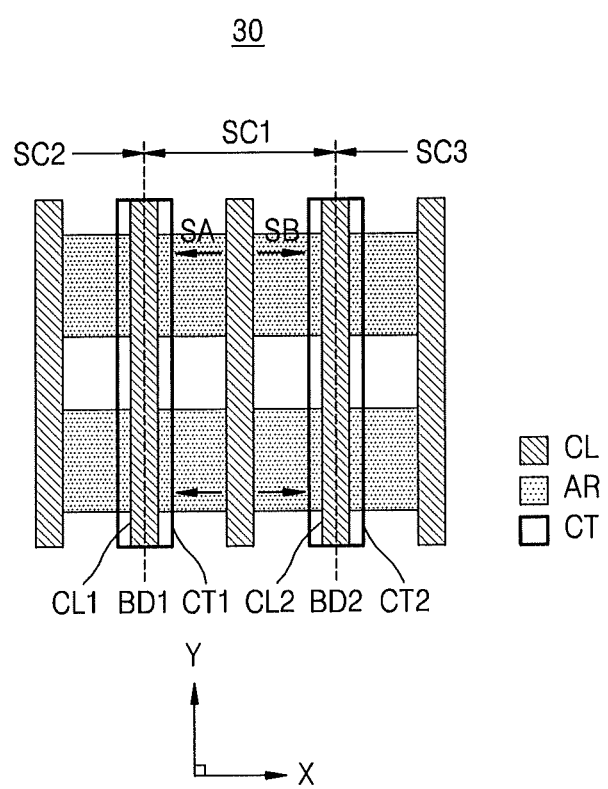
FIG. 3A is a layout of an IC according to an exemplary embodiment.

FIG. 3A is an exemplary embodiment of a layout of an IC 30 in accordance with principles of inventive concepts.

Referring to FIG. 3A, the IC 30 may include first to third standard cells SC1 to SC3. The first and second standard cells SC1 and SC2 may be adjacent to each other on, or along, a first boundary BD1. The first and third standard cells SC1 and SC3 may be adjacent to each other on, or along, a second boundary BD2.

Each of the first to third standard cells SC1 to SC3 may include a plurality of conductive lines CL extending in a first direction (for example, a Y-direction). The number of the conductive lines included in each of the first to third standard cells SC1 to SC3 may variously be selected according to exemplary embodiments. In addition, the first to third standard cells SC1 to SC3 may include active regions AR continuously disposed in a second direction (for example, an X-direction) that is substantially perpendicular to the first direction.

In order to insulate, or isolate, the first standard cell SC1 from the second standard cell SC2, a first cutting layer CT1 may be disposed with respect to a first conductive line CL1 on the first boundary BD1. In such exemplary embodiments, the first conductive line CL1 may become a dummy line. In addition, in order to insulate the first standard cell SC1 from third standard cell SC3, a second cutting layer CT2 may be disposed with respect to a second conductive line CL2 on the second boundary BD2. In such exemplary embodiments, the second conductive line CL2 may become a dummy line.

Figure 3B:
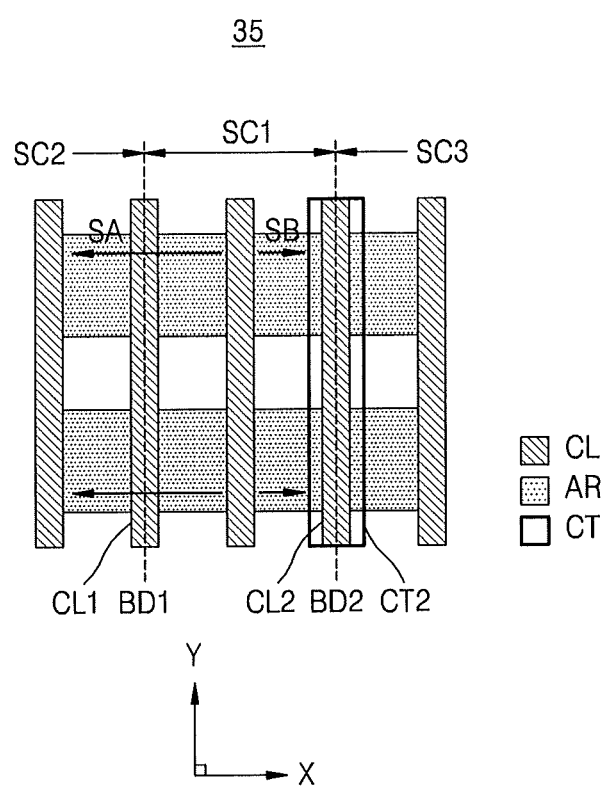
FIG. 3B is a layout of an IC according to another exemplary embodiment.

FIG. 3B is a layout of an IC 35 according to another exemplary embodiment.

Referring to FIG. 3B, the IC 35 differs from the IC 30 in that no first cutting layer CT1 may be disposed with respect to a first conductive layer CL1 on a first boundary BD1. In such exemplary embodiments, a first standard cell SC1 may not be electrically insulated from a second standard cell SC2. The IC 35 is substantially the same as the IC 30 in that a second cutting layer CT2 may be disposed with respect to a second conductive layer CL2 on a second boundary BD2. In such exemplary embodiments, the first standard cell SC1 may be electrically insulated from a third standard cell SC3.

In exemplary embodiments, when the same voltage is to be applied to active regions AR at both sides of the first boundary BD1, the first cutting layer CT1 may not be disposed with respect to the first conductive line CL1 on the first boundary BD1, and the first conductive line CL1 on the first boundary BD1 may be used not as the dummy line, but as a real, or functional, conductive line. In such exemplary embodiments, the first conductive line CL1 may implement a transistor. In particular, the first conductive line CL1 may operate as a gate electrode of the transistor.

In exemplary embodiments, the active regions AR at both sides of the first conductive line CL1 may operate as a source and a drain of the transistor. Because the same voltage is to be applied the active regions AR at both sides of the first conductive line CL1, the transistor may include the first conductive line CL1 and the active regions AR at both sides of the first conductive line CL1, and may operate as a capacitor. In exemplary embodiments, when the voltage applied to the active regions AR at both sides of the first conductive line CL1 is a power supply voltage or a ground voltage, the transistor may operate as a decoupling capacitor connected to a power supply terminal.

Generally, in a process of designing a standard cell, that is, a process of generating a standard cell library, a layout of the standard cell may be designed according to characteristics of a target, or ideal, standard cell itself. However, the characteristics of the target standard cell, for example, timing characteristics, may be changed according to layout patterns of standard cells placed adjacent to each other in a process of placing the standard cell to the target standard cell. In particular, the characteristics of the target standard cell may be changed according to an active region, a conductive line, and a contact included in the adjacent standard cells. A phenomenon as described above, in which characteristics of a device corresponding to the target standard cell are changed according to the peripheral layout patterns, may be referred to as a local layout effect (LLE).

In the first standard cell SC1 of the IC 30, a size (that is, an SA) of a left active region with respect to a conductive line CL may be determined by the first cutting layer CT1, and a size (that is, an SB) of a right active region with respect to the conductive line CL may be determined by the second cutting layer CT2. The SA and the SB may be changed according to standard cells placed adjacent to the first standard cell SC1. As a result, the characteristics of the first standard cell SC1 may be changed. When the SA and the SB of the first standard cell SC1 are decreased by the first and second cutting layer CT1 and CT2, the characteristics of the first standard cell SC1 may be deteriorated and, as a result, performance of a semiconductor device according to the IC 30 may be degraded.

According to exemplary embodiments, because no first cutting layer CT1 is disposed in the IC 35, the size SA of the left active region with respect to the conductive line CL in the first standard cell SC1 may increase compared to the IC 30. Because the second cutting layer CT2 is disposed in the IC 35, the size SB of the right active region with respect to the conductive line CL in the first standard cell SC1 may be substantially the same as the size SB in the IC 30.

As described above, according to exemplary embodiments, because two adjacent standard cells are not insulated from each other, sizes of active regions may be sufficiently secured with respect to at least one conductive line included in each of the standard cells and, as a result, the LLE may be reduced in the IC, thereby further improving the performance of the semiconductor device according to the IC.

Figure 4:
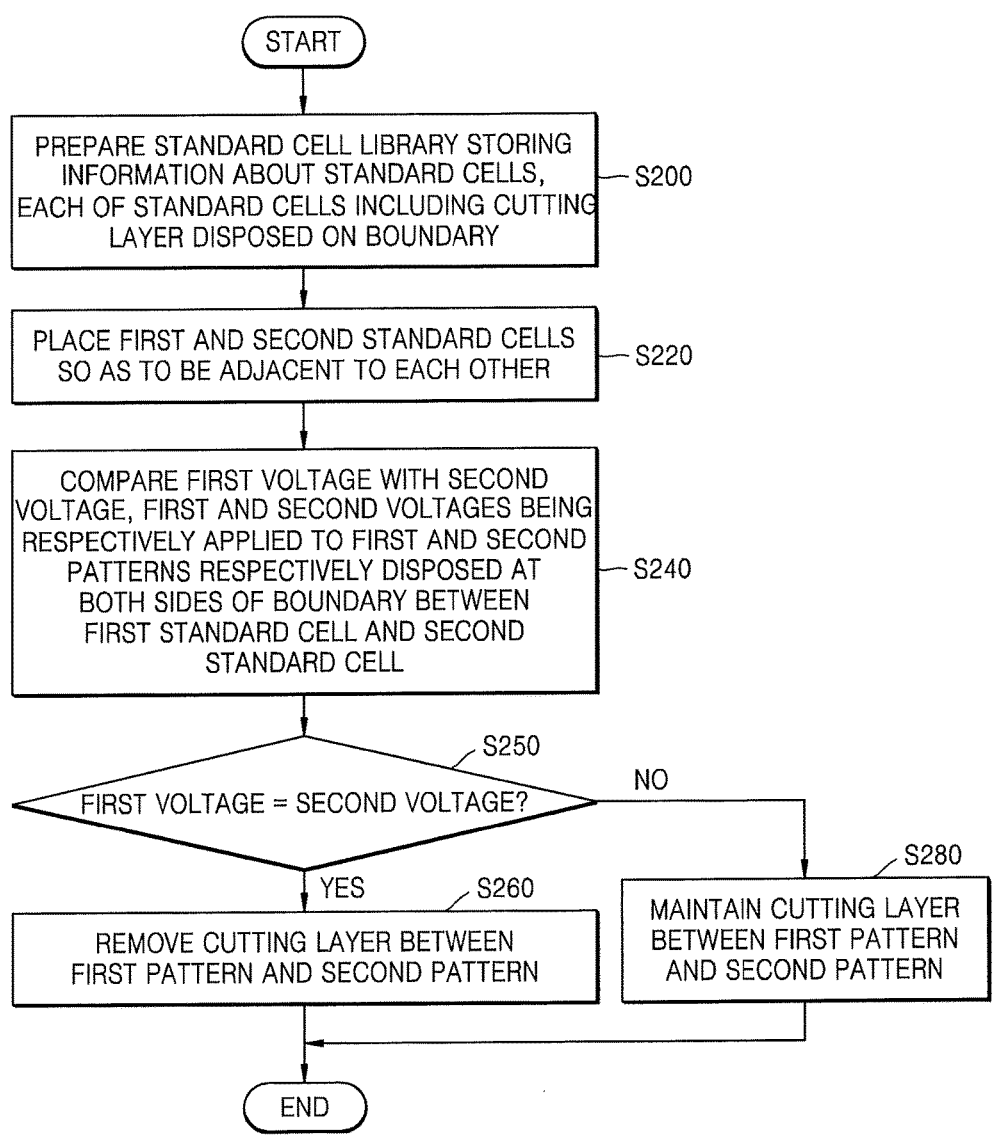
FIG. 4 is a flowchart of a method of designing an IC, according to another exemplary embodiment.

FIG. 4 is a flowchart of a method of designing an IC, according to another exemplary embodiment.

The method of FIG. 4 is a specific exemplary embodiment of the method of FIG. 1. Therefore, the detailed description provided with reference to FIG. 1 may also be applied to the present exemplary embodiment and redundant descriptions thereof will not be repeated here.

In operation S200, a standard cell library may be prepared. The standard cell library may store information about standard cells. Each of the standard cells may include a cutting layer disposed on a boundary. The standard cells may be limited by four boundaries; that is, a cell boundary including first to fourth boundaries. Two standard cells placed adjacent to each other may share one boundary. In exemplary embodiments, each of the standard cells may include a cutting layer on a conductive line disposed on at least one boundary. In another exemplary embodiment, each of the standard cells may include a cutting layer on a conductive line disposed adjacent to at least one boundary.

In operation S220, first and second standard cells may be placed adjacent to each other. In exemplary embodiments, the first and second standard cells may be placed adjacent to each other in a first boundary. In exemplary embodiments, information about the first and second standard cells may be acquired from the standard cell library based on input data for defining the IC, and the first and second standard cells may be placed adjacent to each other according to the acquired information.

In exemplary embodiments, the first standard cell may include a cutting layer disposed on or adjacent to the first boundary. The second standard cell may include a cutting layer disposed on or adjacent to the first boundary. In exemplary embodiments, the cutting layer in the first standard cell may overlap the cutting layer in the second standard cell. In another exemplary embodiment, the cutting layer in the first standard cell may be spaced apart from the cutting layer in the second standard cell.

In another exemplary embodiment, the first standard cell may include a cutting layer disposed on or adjacent to the first boundary. The second standard cell may not include a cutting layer disposed on or adjacent to the first boundary. In another exemplary embodiment, the second standard cell may not include a cutting layer disposed on or adjacent to the first boundary. The second standard cell may include a cutting layer disposed on or adjacent to the first boundary.

In operation S240, a first voltage may be compared with a second voltage. The first and second voltages are respectively applied to first and second patterns respectively disposed at both sides of the first boundary between the first standard cell and the second standard cell. In exemplary embodiments, the first pattern may be a contact for applying a voltage to an active region or an active fin in the first standard cell. In exemplary embodiments, the voltage applied to the first pattern may be the first voltage and the second pattern may be a contact for applying a voltage to an active region or an active fin in the second standard cell. The voltage applied to the second pattern may be the second voltage.

In operation S250, it is determined whether the first voltage is substantially the same as the second voltage. As a result of the determination, when the first voltage is substantially the same as the second voltage, operation S260 may be performed. On the other hand, when the first voltage is not substantially the same as the second voltage, operation S280 may be performed.

In operation S260, the cutting layer may be removed between the first pattern and the second pattern. As a result, a diffusion break may be removed between the first pattern and the second pattern and the first standard cell may be electrically connected to the second standard cell.

In exemplary embodiments, each of the first and second standard cells may be designed to include a plurality of conductive lines parallel to the first boundary, and the cutting layer on at least one conductive line between the first standard cell and the second standard cell may be removed. Therefore, the at least one conductive line between the first standard cell and the second standard cell may be a real, or operational, conductive line, and the real conductive line may implement a transistor.

In exemplary embodiments, the first pattern or an active region connected to the first pattern and the second pattern or an active region connected to the second pattern, may implement a source and a drain of the transistor. In exemplary embodiments, because the first voltage applied to the first pattern is substantially the same as the second voltage applied to the second pattern, the transistor may operate as a capacitor. In exemplary embodiments, when the first and second patterns are connected to a power supply voltage terminal or a ground voltage terminal, the transistor may operate as a decoupling capacitor.

In operation S280, the cutting layer may be maintained between the first pattern and the second pattern and, as a result, the diffusion break may be maintained between the first pattern and the second pattern, and the first standard cell may be electrically insulated from the second standard cell.

FIG. 5 is a layout to which the method of FIG. 4 is applied, according to exemplary embodiments.

Referring to FIG. 5, the IC 50 may include, for example, a layout after operation S220 and may include first to third standard cells SC1 to SC3, which are placed adjacent to each other. The first and second standard cells SC1 and SC2 may be adjacent to each other in a first boundary BD1. The first and third cells standard SC1 and SC3 may be adjacent to each other in a second boundary BD2.

Each of the first to third standard cells SC1 to SC3 may include active regions AR continuously disposed in a second direction (for example, an X-direction). In exemplary embodiments, the active regions AR included in the first to third standard cells SC1 to SC3 may be connected to each other. In particular, active regions AR disposed adjacent to each other in the second direction may be connected to each other.

The first and third standard cells SC1 to SC3 may further include fins FN on the active regions AR. The fins FN may extend in the second direction and may be disposed in parallel to each other in a first direction (for example, a Y-direction) substantially perpendicular to the second direction. The fins FN on the active regions AR may be referred to as active fins. Although not illustrated, the fins FN may be disposed between the active regions AR. The fins FN between the active regions AR may be referred to as dummy fins.

Each of the first to third standard cells SC1 to SC3 may include a plurality of conductive lines CL extending in the first direction. In exemplary embodiments, the plurality of conductive lines CL may be disposed on a plurality of fins FN. Specifically, the plurality of conductive lines CL may be disposed across the plurality of fins FN.

In exemplary embodiments, a first cutting layer CT1 may be disposed on a first conductive line CL1 on the first boundary BD1. Accordingly, the fins FN may be separated between the first standard cell SC1 and the second standard cell SC2. In particular, the fins FN disposed adjacent to each other in the second direction may be separated by the first cutting layer CT1. Accordingly, the first standard cell SC1 may be insulated from the second standard cell SC2 and, as a result, the first conductive line CL1 may be a dummy line and may not implement a transistor.

In exemplary embodiments, a second cutting layer CT2 may be disposed on a second conductive line CL2 on the second boundary BD2. Accordingly, the fins FN may be separated between the first standard cell SC1 and the third standard cell SC3. In particular, the fins FN disposed adjacent to each other in the second direction may be separated by the second cutting layer CT2. Accordingly, the first standard cell SC1 may be insulated from the third standard cell SC3 and, as a result, the second conductive line CL2 may be a dummy line and may not implement a transistor.

Each of the first to third standard cells SC1 to SC3 may include contact patterns CA disposed on the fins FN. In exemplary embodiments, the contact patterns CA may apply voltages to the fins FN connected thereto, respectively. In exemplary embodiments, the contact patterns CA may have different sizes and different shapes and may be disposed at the same level.

In exemplary embodiments, the first standard cell SC1 may include first contact patterns CA1a and CA1b disposed adjacent to the first boundary BD1 and first contact patterns CA1c and CA1d disposed adjacent to the second boundary BD2. The second standard cell SC2 may include second contact patterns CA2a and CA2b disposed adjacent to the first boundary BD1. The third standard cell SC3 may include third contact patterns CA3a and CA3b disposed adjacent to the second boundary BD2.

According to exemplary embodiments, after the process of placing the first to third standard cells SC1 to SC3, voltages may be compared with each other, the voltages being applied to the patterns disposed adjacent to each other in the second direction at both sides of the first boundary BD1. In particular, a voltage V1 applied to the first contact pattern CA1a may be compared with a voltage V2 applied to the second contact pattern CA2a. In addition, a voltage V3 applied to the first contact pattern CA1b may be compared with a voltage V4 applied to the second contact pattern CA2b.

As a result of the comparison, when the voltages V1 and V3 are respectively substantially the same as the voltages V2 and V4, the first cutting layer CT1 disposed on the first conductive line CL1 may be removed. The voltages V1 and V3 are respectively applied to the first contact patterns CA1a and CA1b, and the voltages V2 and V4 are respectively applied to the second contact patterns CA2a and CA2b. As described above, in an IC 55 in which the first cutting layer CT1 on the first conductive line CL1 is removed, the first conductive line CL1 may be used as a real, or operational, conductive line to implement a transistor. Specifically, the first conductive line CL1 may implement a gate electrode of the transistor.

The fins FN respectively connected to the first and second contact patterns CA1a and CA2a at both sides of the first conductive line CL1 may implement a source and a drain of the transistor. In exemplary embodiments, the same power supply voltage may be applied to the first and second contact patterns CA1a and CA2a. Accordingly, the transistor may include the fins FN connected to the first and second contact patterns CA1a and CA2a and the first conductive line CL1 and may correspond to a decoupling capacitor. In addition, the fins FN respectively connected to the first and second contact patterns CA1b and CA2b at both sides of the first conductive lines CL1 may implement a source and a drain of a transistor. In exemplary embodiments, the same ground voltage may be applied to the first and second contact patterns CA1b and CA2b and, accordingly, the transistor may include the fins FN respectively connected to the first and second contact patterns CA1b and CA2b and the first conductive line CL1 and may correspond to the decoupling capacitor.

According to exemplary embodiments, after the placement operation, voltages may be compared to each other, with the voltages being applied to the patterns disposed adjacent to each other in the second direction at both sides of the second boundary BD2. For example, a voltage V5 applied to the first contact pattern CA1c may be compared with a voltage V6 applied to the third contact pattern CA3a. In addition, a voltage V7 applied to the first contact pattern CA1d may be compared with a voltage V8 applied to the third contact pattern CA3b.

As a result of the comparison, when the voltage V5 and V7 respectively differ from the voltages V6 and V8, the second cutting layer CT2 disposed on the second conductive line CL2 may be maintained. The voltages V5 and V7 are respectively applied to the first contact patterns CA1c and CA1d, and the voltages V6 and V8 are respectively applied to the third contact patterns CA3a and CA3b. In such exemplary embodiments, the second cutting layer CT2 may be used as a single diffusion break.

Figure 6:
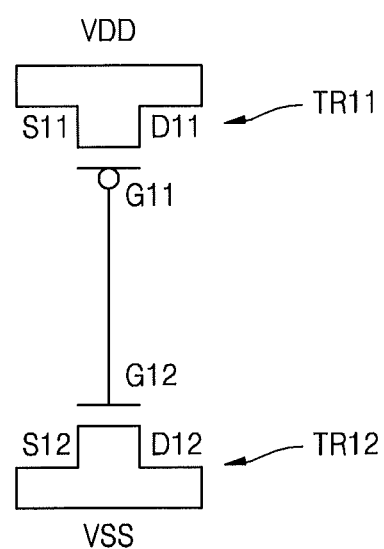
FIG. 6 is a circuit diagram of a decoupling capacitor of FIG. 5, according to an exemplary embodiment.

FIG. 6 is a circuit diagram of a decoupling capacitor DC1 of FIG. 5, according to an exemplary embodiment.

Referring to FIG. 6, the decoupling capacitor DC1 may include first and second transistors TR11 and TR12. The first transistor TR11 may be connected to a power supply voltage terminal VDD. The second transistor TR12 may be connected to a ground voltage terminal VSS.

The first transistor TR11 may include a first source S11 and a first drain D11, which are connected to a power supply voltage terminal VDD. For example, the first source S11 may be first and second fins FN1 and FN2 connected to the second contact pattern CA2a in the IC 55 of FIG. 5 and the first drain D11 may be first and second fins FN1 and FN2 connected to the first contact pattern CA1a in the IC 55 of FIG. 5.

The second transistor TR12 may include a second source S12 and a second drain D12, which are connected to a ground voltage terminal VSS. For example, the second source S12 may be first and second fins FN1 and FN2 connected to the second contact pattern CA2b in the IC 55 of FIG. 5 and the second drain D12 may be first and second fins FN1 and FN2 connected to the first contact pattern CA1b in the IC 55 of FIG. 5.

The first transistor TR11 may further include a first gate electrode G11 biased by a predetermined voltage. The second transistor TR12 may further include a second gate electrode G12 biased by a predetermined voltage. In exemplary embodiments, the first gate electrode G11 may be connected to the second gate electrode G12. The first and second gate electrodes G11 and G12 may be the first conductive line CL1 included in the IC 55 of FIG. 5. In exemplary embodiments, a gate voltage may be applied to the first conductive line CL1.

Figure 7:
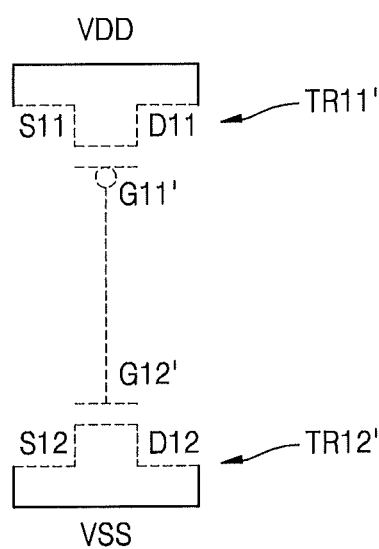
FIG. 7 is a circuit diagram of a decoupling capacitor of FIG. 5, according to another exemplary embodiment.

FIG. 7 is a circuit diagram of an exemplary embodiment of a decoupling capacitor DC2 of FIG. 5 in accordance with principles of inventive concepts.

Referring to FIG. 7, the decoupling capacitor DC2 may include first and second transistors TR11' and TR12'. The first transistor TR11' may be connected to a power supply voltage terminal VDD. The second transistor TR12' may be connected to a ground voltage terminal VSS.

The first transistor TR11' may include a first source S11 and a first drain D11, which are connected to the power supply voltage terminal VDD. For example, the first source S11 may be the first and second fins FN1 and FN2 connected to the second contact pattern CA2a in the IC 55 of FIG. 5 and the first drain D11 may be the first and second fins FN1 and FN2 connected to the first contact pattern CA1a in the IC 55 of FIG. 5.

The second transistor TR12' may include a second source S12 and a second drain D12, which are connected to the ground voltage terminal VSS and the second source S12 may be the first and second fins FN1 and FN2 connected to the second contact pattern CA2b in the IC 55 of FIG. 5. For example, the second drain D12 may be the first and second fins FN1 and FN2 connected to the first contact pattern CA1b in the IC 55 of FIG. 5.

The first transistor TR11' may further include a first gate electrode G11'. The second transistor TR12' may further include a second gate electrode G12'. In exemplary embodiments, the first gate electrode G11' may be connected to the second gate electrode G12'. The first and second gate electrodes G11' and G12' may be the first conductive line CL1 included in the IC 55 of FIG. 5. In exemplary embodiments, the first conductive line CL1 may float.

Figure 8:
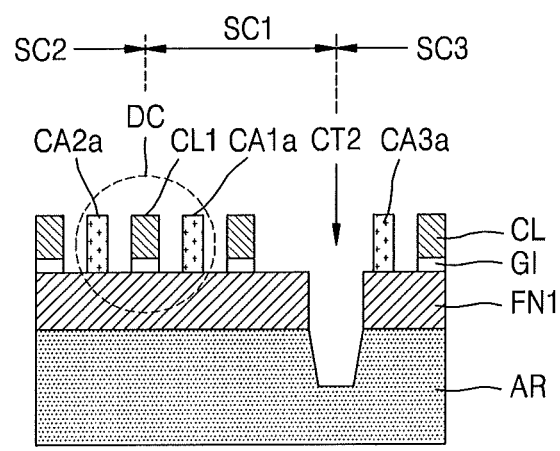
FIG. 8 is a cross-sectional view taken along line VIII-VIII' of the layout of FIG. 5, according to an exemplary embodiment.

FIG. 8 is a cross-sectional view taken along line VIII-VIII' of the layout of FIG. 5, according to an exemplary embodiment.

Referring to FIG. 8, a semiconductor device according to a layout of the IC 55 may be manufactured as illustrated in FIG. 8. In particular, first fins FN1 may be disposed on an active region AR. Because, in exemplary embodiments, a first cutting layer CT1 is removed between a first and standard cell SC1 and a second standard cell SC2 in the IC 55, the first fins FN1 may be disposed in the first and second standard cells SC1 and SC2 to be connected to each other. Because a second cutting layer CT2 is maintained between the first standard cell SC1 and a third standard cell SC3, the first fins FN1 may be cut between the first standard cell SC1 and the third standard cells SC3.

An insulating layer GI may be disposed on the first fins FN1 and conductive lines CL may be disposed on the insulating layer GI. In exemplary embodiments, the insulating layer GI may be a gate insulating layer, and the conductive lines CL may be gate electrodes. In addition, a second contact pattern CA2a, a first contact pattern CA1a, and a third contact pattern CA3a may be disposed on the first fins FN1.

In exemplary embodiments, the same power supply voltage may be applied to the first and second contact patterns CA1a and CA2a, and the first fins FN1 connected to the first and second contact patterns CA1a and CA2a and the first conductive line CL1 between the first contact pattern CA1a and the second contact pattern CA2a may implement a transistor corresponding to a decoupling capacitor DC. Because the first fins FN1 are cut between the first standard cell SC1 and the third standard cell SC3, the first standard cell SC1 may be electrically insulated from the third standard cell SC3.

Figure 9:
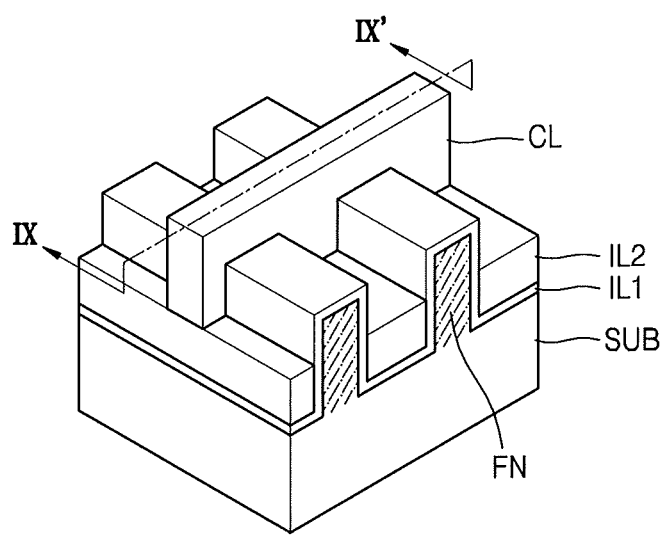
FIG. 9 is a perspective view of a semiconductor device having the layout of FIG. 6, according to an exemplary embodiment.
Figure 10:
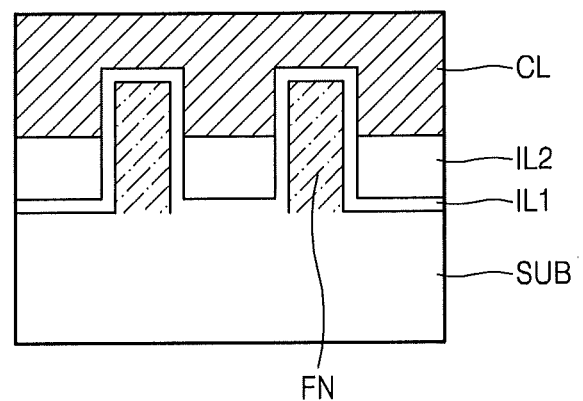
FIG. 10 is a cross-sectional view taken along line IX-IX' of FIG. 9, according to an exemplary embodiment.

FIG. 9 is a perspective view of a semiconductor device 100a having the layout of FIG. 5, according to an exemplary embodiment. FIG. 10 is a cross-sectional view taken along line IX-IX' of the layout of FIG. 9, according to an exemplary embodiment.

Referring to FIGS. 9 and 10, the semiconductor device 100a may be a bulk type fin transistor and may include a substrate SUB, a first insulating layer IL1 a second insulating layer IL2, fins FN, and a conductive line CL (hereinafter, referred to as a gate electrode).

The substrate SUB may be a semiconductor substrate. For example, the semiconductor substrate may include any one selected from silicon, silicon-on-insulator, silicon-on-sapphire, germanium, and gallium arsenide. The substrate SUB may be a P-type substrate and may be used as an active region AR1. The fins FN may be connected to the substrate SUB. In exemplary embodiments, the fins FN may be n+-doped or p+-doped active regions that vertically protrude from the substrate SUB and being n+ or P+-doped.

The first and second insulating layers IL1 and IL2 may include an insulating material. For example, the insulating material may include any one selected from an oxide film, a nitride film, and an oxynitride film. The first insulating layer IL1 may be disposed on the fins FN. The first insulating layer IL1 may be disposed between the fins FN and the gate electrode CL and may be used as a gate insulating film. The second insulating layer IL2 may be disposed in spaces between the fins FN to have a predetermined height. The second insulating layer IL2 may be disposed between the fins FN and may be used as an element isolation film.

The gate electrode CL may be disposed on the first and second insulating layers IL1 and IL2. Accordingly, the gate electrode CL may have a structure that surrounds the fins FN and the first and second insulating layers IL1 and IL2. That is, the fins FN may have structures that are disposed in the gate electrode CL. The gate electrode CL may include metal materials such as tungsten (W) and tantalum (Ta), nitrides thereof, silicides thereof, or doped polysilicon. The gate electrode CL may be formed by a deposition process.

Figure 11:
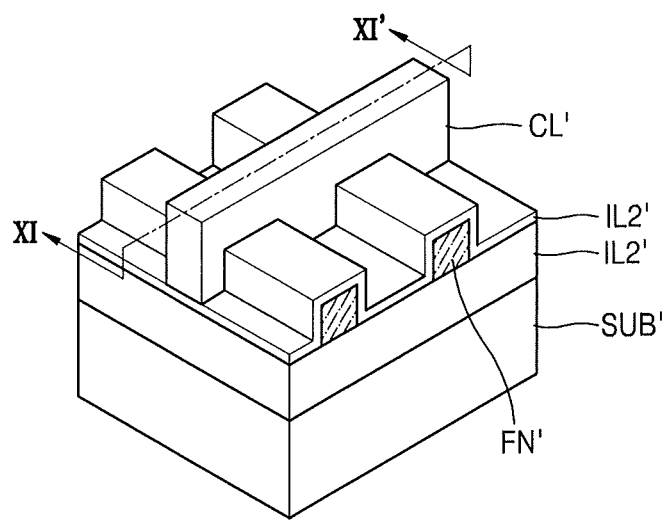
FIG. 11 is a perspective view of a semiconductor device having the layout of FIG. 6, according to another exemplary embodiment.
Figure 12:
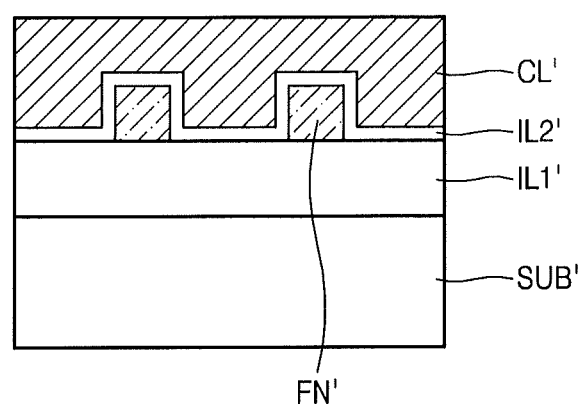
FIG. 12 is a cross-sectional view taken along line XI-XI' of FIG. 11, according to an exemplary embodiment.

FIG. 11 is a perspective view of a semiconductor device 100b having the layout of FIG. 6, according to another exemplary embodiment. FIG. 12 is a cross-sectional view taken along line XI-XI' of the layout of FIG. 11, according to an exemplary embodiment.

Referring to FIGS. 11 and 12, the semiconductor device 100b may be an SOI type fin transistor. The semiconductor device 100b may include a substrate SUB', a first insulating layer IL1', a second insulating layer IL2', fins FN', and a conductive line CL' (hereinafter, referred to as a gate electrode). Because the semiconductor device 100b according to exemplary embodiments is a modification of the semiconductor device 100a illustrated in FIGS. 9 and 10, hereinafter, the semiconductor device 100b will be described focused on the difference, and redundant descriptions thereof will not be repeated here.

The first insulating layer IL1' may be disposed on the substrate SUB'. The second insulating layer IL2' may be disposed between the fins FN and the gate electrode CL' and may be used as a gate insulating film. The fins FN' may be a semiconductor material, for example, silicon or doped silicon.

The gate electrode CL' may be disposed on the second insulating layer IL2'. Accordingly, the gate electrode CL' may have a structure that surrounds the fins FN' and the second insulating layer IL2'. That is, the fins FIN may have structures that are disposed in the gate electrode CL'.

Figure 13:
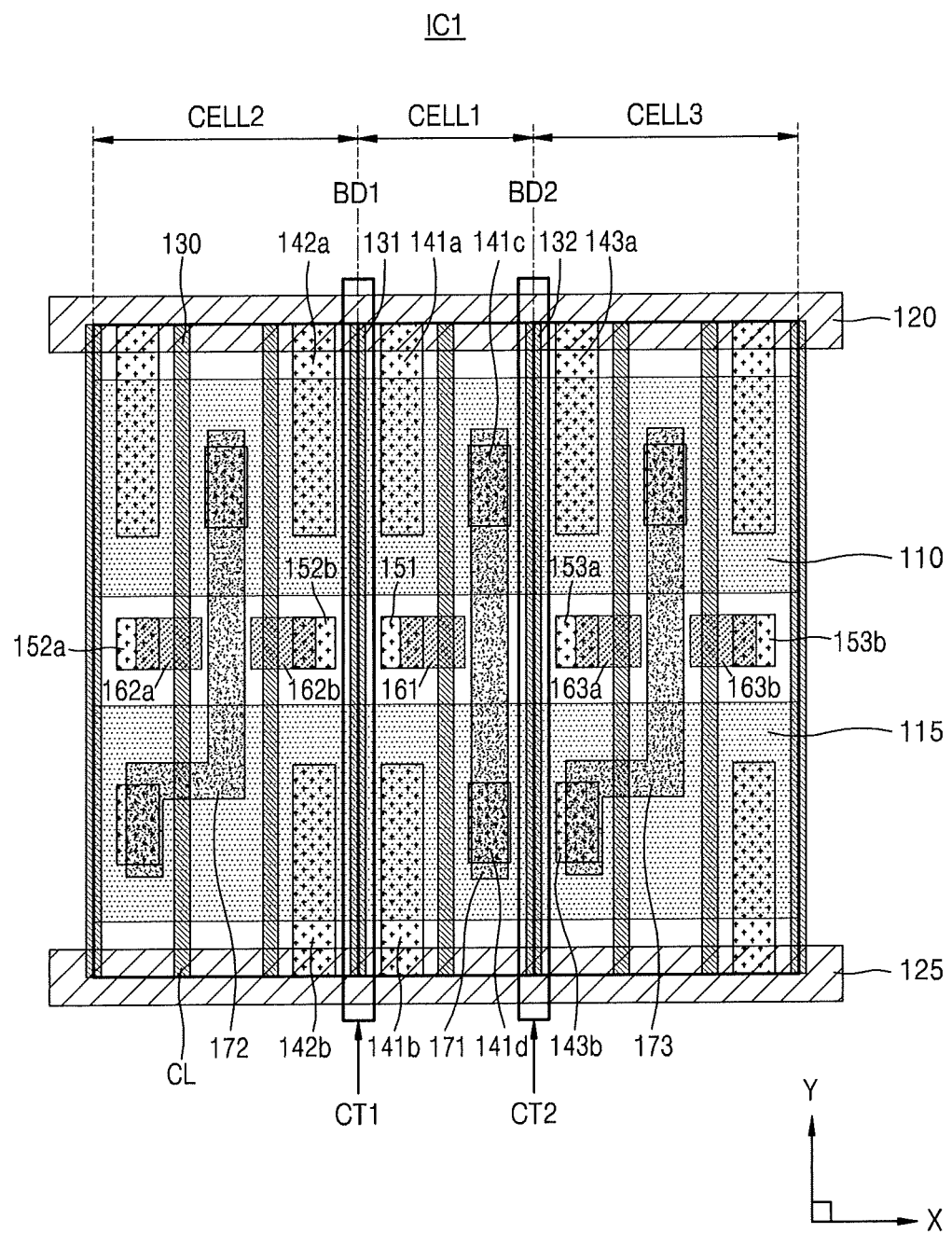
FIG. 13 is a layout of an IC including a plurality of cells placed adjacent to each other, according to an exemplary embodiment.

FIG. 13 is a layout of an IC IC1 including a plurality of cells placed adjacent to each other, according to an exemplary embodiment.

Referring to FIG. 13, the IC IC1 may have, for example, a layout after operation S220 of FIG. 4 and may include first to third cells CELL1 to CELL3, which are placed adjacent to each other. The first and second cells CELL1 and CELL2 may be adjacent to each other in a first boundary BD1. The first and third cells CELL1 and CELL3 may be adjacent to each other in a second boundary BD2.

The IC IC1 may include first and second active regions 110 and 115 that are parallel to each other in a first direction (for example, a Y-direction) and are continuously disposed in a second direction (for example, an X-direction). The first and second active regions 110 and 115 may have different conductivity-types. In exemplary embodiments, the first active regions 110 included in the first to third cells CELL1 to CELL3 may be connected to each another, and the second active regions 115 included in the first to third cells CELL1 to CELL3 may be connected to each other. In addition, the IC IC1 may further include first and second power lines 120 and 125 that extend in the second direction. In the present exemplary embodiment, the first power line 120 and the second power line 125 may be connected to a power supply voltage terminal VDD and a ground voltage terminal VSS, respectively. The first and second power lines 120 and 125 may be referred to as first and second power rails.

Each of the first to third cells CELL1 to CELL3 may include a plurality of gate electrodes 130 that extend in the first direction and are disposed in parallel to each other in the second direction. Although not illustrated, the first to third cells CELL1 to CELL3 may further include a plurality of fins that are disposed on the first and second active regions 110 and 115. In particular, the first cell CELL1 may further include source/drain contacts 141a to 141d, an input terminal 151, an input contact 161, and an output terminal 171. The second cell CELL2 may further include source/drain contacts 142a and 142b, input terminals 152a and 152b, input contacts 162a and 162b, and an output terminal 172. The third cell CELL3 may further include source/drain contacts 143a and 143b, input terminals 153a and 153b, input contacts 163a and 163b, and an output terminal 173.

In exemplary embodiments, a first cutting layer CT1 may be disposed on a first gate electrode 131 on the first boundary BD1, and a second cutting layer CT2 may be disposed on a second gate electrode 132 on the second boundary BD2. In such exemplary embodiments, each of the first and second cutting layers CT1 and CT2 may be function as a single diffusion break.

Figure 14:
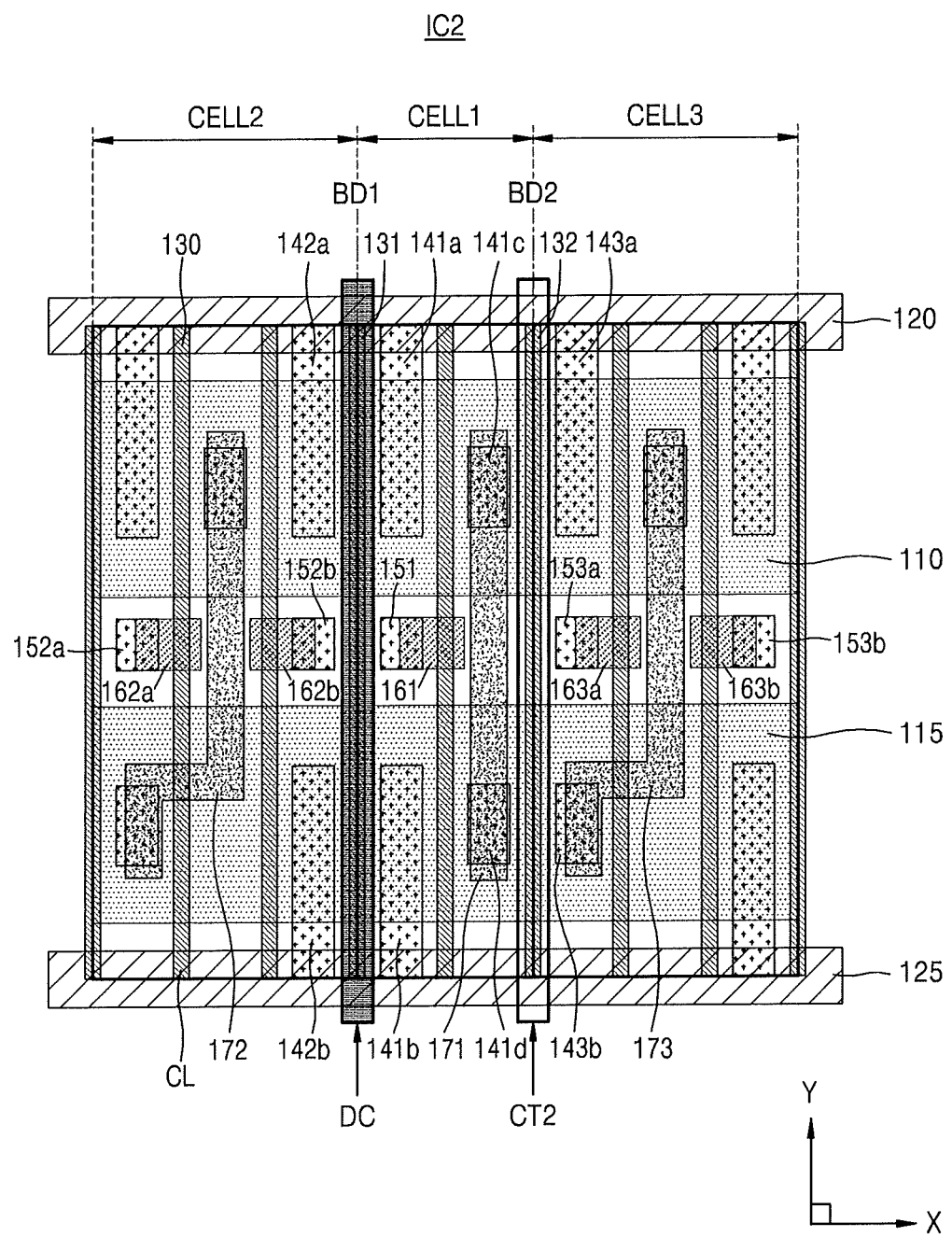
FIG. 14 is a layout of an IC including a decoupling capacitor, according to an exemplary embodiment.

FIG. 14 is a layout of an IC IC2 including a decoupling capacitor, according to an exemplary embodiment.

Referring to FIG. 14, the IC IC2 according to exemplary embodiments may have a layout in which a decoupling capacitor DC is generated by removing the first cutting layer CT1 between the first cell CELL1 and the second CELL2 in the IC IC1 of FIG. 13. As compared with the IC IC1 of FIG. 13, in the IC IC2, a second cutting layer CT2 may be maintained between the first cell CELL1 and the third cell CELL3.

In exemplary embodiments, because a source/drain contact 141a adjacent to a first boundary BD1 in the first cell CELL1 is connected to a first power line 120, the first source/drain contact 141a may be connected to a power supply voltage terminal VDD. In addition, because a source/drain contact 142a adjacent to the first boundary BD1 in the second cell CELL2 is also connected to the first power line 120, the source/drain contact 142a may be connected to the power supply voltage terminal VDD. Because the same power supply voltage terminal VDD is connected to the source/drain contacts 141a and 142a at both sides of a first gate electrode 131 in a first active region 110, the first cutting layer CT1 may be removed between the source/drain contact 141a and the source/drain contact 142a.

In exemplary embodiments, because a source/drain contact 141b adjacent to the first boundary BD1 in the first cell CELL1 is connected to a second power line 125, the source/drain contact 141b may be connected to a ground voltage terminal VSS. In addition, because a source/drain contact 142b adjacent to the first boundary BD1 in the second cell CELL2 is also connected to the second power line 125, the source/drain contact 142b may be connected to the ground voltage terminal VSS. Because the same ground voltage terminal VSS is connected to the source/drain contacts 141b and 142b at both sides of the first gate electrode 131 in a second active region 115, the first cutting layer CT1 may be removed between the source/drain contact 141b and the source/drain contact 142b.

In exemplary embodiments, a source/drain contact 141c adjacent to a second boundary BD2 in the first cell CELL1 may be connected to an output terminal 171, and a source/drain contact 143a adjacent to the second boundary BD2 in the third cell CELL3 may be connected to the first power line 120. Different voltages may be applied to the source/drain contacts 141c and 143a at both sides of the second boundary BD2 in the first active region 110. Therefore, the second cutting layer CT2 may be maintained between the source/drain contact 141c and the source/drain contact 143a and may function as a single diffusion break.

In exemplary embodiments, a source/drain contact 141d adjacent to the second boundary BD2 in the first cell CELL1 may be connected to the output terminal 171, and a source/drain contact 143b adjacent to the second boundary BD2 in the third cell CELL3 may be connected to the second power line 125. Different voltages may be applied to the source/drain contacts 141d and 143b at both sides of the second boundary BD2 in the second active region 115. As a result, the second cutting layer CT2 may be maintained between the source/drain contact 141d and the source/drain contact 143b and may function as the single diffusion break.

Figure 15:
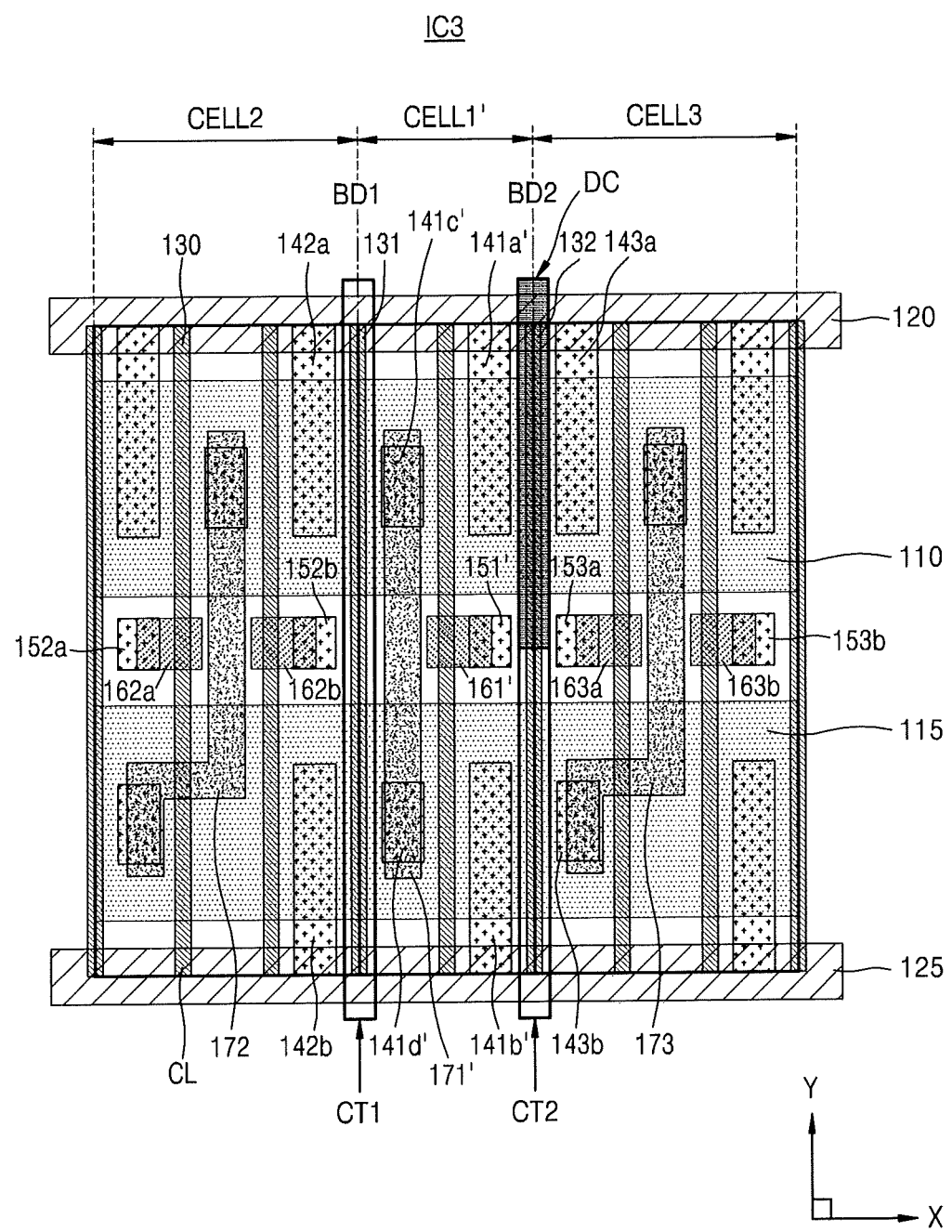
FIG. 15 is a layout of an IC including a decoupling capacitor, according to another exemplary embodiment.

FIG. 15 is a layout of an IC IC3 including a decoupling capacitor, according to an exemplary embodiment.

The IC IC3 of FIG. 15 is a modification of the IC IC2 of FIG. 14. The detailed description provided with reference to FIG. 14 may also be applied to the exemplary embodiment of FIG. 15, and redundant descriptions thereof will not be repeated here. The IC IC3 may include a first flip cell CELL1' and second and third cells CELL2 and CELL3, which are placed adjacent to each other. The first flip cell CELL1' and the second cell CELL2 may be adjacent to each other in a first boundary BD1. The first flip cell CELL1' and the third cell CELL3 may be adjacent to each other in a second boundary BD2.

In exemplary embodiments, a method of designing a layout of the IC IC3 may include forming one of two cells as a flip cell symmetrically to a Y-axis, and forming the other cell placed adjacent to the flip cell, based on a comparison result of voltages applied to patterns that are disposed at both sides of a boundary between the two cells placed adjacent to each other. However, inventive concepts are not limited thereto. One of the two cells may be formed as the flip cell symmetrically to any axis parallel to the boundary between the two cells. For example, after operation S240 or S250 of FIG. 4, a method according to exemplary embodiments may further include forming one of first and second standard cells as a flip cell symmetrically to the Y-axis, and forming the other standard cell placed adjacent to the flip cell.

In exemplary embodiments, the first flip cell CELL1' may be formed by placing the first cell CELL1 included in the IC IC1 of FIG. 13 symmetrically to the Y-axis. According to exemplary embodiments, as compared with the IC IC1 of FIG. 13, a first cutting layer CT1 may be maintained between the first flip cell CELL1' and the second cell CELL2, and a second cutting layer CT2 may be removed between the first flip cell CELL1' and the third cell CELL3.

The IC IC3 may include first and second active regions 110 and 115 that are parallel to each other in a first direction (for example, a Y-direction) and are continuously disposed in a second direction (for example, an X-direction). In exemplary embodiments, the first active regions 110 included in the first flip cell CELL1' and the second and third cells CELL2 and CELL3 may be connected to each other, and the second active regions 115 included in the first flip cell CELL1' and the second and third cells CELL2 and CELL3 may be connected to each other. In addition, the IC IC3 may further include first and second power lines 120 and 125 that extend in the second direction. In exemplary embodiments, the first power line 120 and the second power line 125 may be connected to a power supply voltage terminal VDD and a ground voltage terminal VSS, respectively. The first and second power lines 120 and 125 may be referred to as first and second power rails.

Each of the first flip cell CELL1' and the second and third cells CELL2 and CELL3 may include a plurality of gate electrodes 130 that extend in the first direction and are disposed adjacent to each other in the second direction. Although not illustrated, the first flip cell CELL1' and the second and third cells CELL2 and CELL3 may further include a plurality of fins that are disposed on the first and second active regions 110 and 115. In particular, the first cell CELL1' may further include source/drain contacts 141a' to 141d', an input terminal 151', an input contact 161', and an output terminal 171'. The second cell CELL2 may further include source/drain contacts 142a and 142b, input terminals 152a and 152b, input contacts 162a and 162b, and an output terminal 172. The third cell CELL3 may further include source/drain contacts 143a and 143b, input terminals 153a and 153b, input contacts 163a and 163b, and an output terminal 173.

In exemplary embodiments, because the source/drain contact 141a' adjacent to a second boundary BD2 in the first flip cell CELL1' is connected to the first power line 120, the first source/drain contact 141a' may be connected to the power supply voltage terminal VDD. In addition, because the source/drain contact 143a adjacent to a second boundary BD2 in the third cell CELL3 is connected to the first power line 120, the source/drain contact 143a may be connected to the power supply voltage terminal VDD. Therefore, since the same power supply voltage terminal VDD is connected to the source/drain contacts 141a' and 143a at both sides of a second gate electrode 132 in the first active regions 110, the second cutting layer CT2 above the first active regions 110 may be removed between the source/drain contact 141a' and the source/drain contact 143a.

In exemplary embodiments, because the source/drain contact 141b' adjacent to the second boundary BD2 in the first flip cell CELL1' is connected to the second power line 125, the source/drain contact 141b' may be connected to the ground voltage terminal VSS. However, because the source/drain contact 143b adjacent to the second boundary BD2 in the third cell CELL3 is connected to the output terminal 173, the source/drain contact 143b may not be connected to the ground voltage terminal VSS. Different voltages may be applied to the source/drain contacts 141b' and 143b at both sides of the second boundary BD2 in the second active regions 115. Therefore, the second cutting layer CT2 above the second active regions 115 may be maintained between the source/drain contacts 141b' and 143b and may function as a single diffusion break.

In exemplary embodiment, the source/drain contact 141c' adjacent to the first boundary BD1 in the first flip cell CELL1' may be connected to the output terminal 171', and the source/drain contact 142a adjacent to the first boundary BD1 in the second cell CELL2 may be connected to the first power line 120. Different voltages may be applied to the source/drain contacts 141c' and 142a at both sides of the first boundary BD1 in the first active regions 110. Therefore, the first cutting layer CT1 may be maintained between the source/drain contact 141c' and the source/drain contact 142a and may function as a single diffusion break.

In exemplary embodiments, the source/drain contact 141d' adjacent to the first boundary BD1 in the first flip cell CELL1' may be connected to the output terminal 171', and the source/drain contact 142b adjacent to the first boundary BD1 in the second cell CELL2 may be connected to the second power line 125. Different voltages may be applied to the source/drain contacts 141d' and 142b at both sides of the first boundary BD1 in the second active regions 115. As a result, the first cutting layer CT1 may be maintained between the source/drain contacts 141d' and the source/drain contact 142b and may function as a single diffusion break.

FIG. 16 is a layout to which the method of FIG. 4 is applied, according to another exemplary embodiment.

Referring to FIG. 16, an IC 160 may have, for example, a layout after operation S220 of FIG. 4 and may include first to third standard cells SC1' to SC3', which are placed adjacent to each other. The first and second standard cells SC1' and SC2' may be adjacent to each other in a first boundary BD1. The first and third standard cells SC1' and SC3' may be adjacent to each other in a second boundary BD2.

Each of the first to third standard cells SC1' to SC3' may include active regions AR continuously disposed in a second direction (for example, an X-direction). In exemplary embodiments, the active regions AR included in the first to third standard cells SC1' to SC3' may be connected to each other. In particular, the active regions AR disposed adjacent to each other in the second direction may be connected to each other.

The first to third standard cells SC1' to SC3' may further include fins FN on the active regions AR. The fins FN may extend in the second direction and may be disposed in parallel to each other in a first direction (for example, a Y-direction) substantially perpendicular to the second direction. The fins FN on the active regions AR may be referred to as active fins. Although not illustrated, the fins FN may be disposed between the active regions AR. The fins FN between the active regions AR may be referred to as dummy fins.

The first standard cell SC1' may include conductive lines CL11, CL12, and CL13. The second standard cell SC2' may include conductive lines CL21 and CL22. The third standard cell SC3' may include conductive lines CL31 and CL33. As described above, according to exemplary embodiments, a conductive line may not be disposed on the first and second boundaries BD1 and BD2. Accordingly, a cutting layer may not be disposed on the first and second boundaries BD1 and BD2.

In exemplary embodiments, the first standard cell SC1' may include a cutting layer CT11 disposed on the conductive line CL11 adjacent to the first boundary BD1. As a result, the fins FN may be separated between the first standard cell SC1' and the second standard cell SC2', and, thus, the first standard cell SC1' may be electrically insulated from the second standard cell SC2'. In addition, the first standard cell SC1' may include a cutting layer CT12 disposed on the conductive line CL13 adjacent to the second boundary BD2. Therefore, the fins FN may be separated between the first standard cell SC1' and the third standard cell SC3', and, thus, the first standard cell SC1' may be electrically insulated from the third standard cell SC3'.

However, inventive concepts are not limited thereto. In another exemplary embodiment, the first standard cell SC1' may include only the cutting layer CT11 disposed on the conductive line CL11 adjacent to the first boundary BD1. In another exemplary embodiment, the first standard cell SC1' may include only the cutting layer CT12 disposed on the conductive line CL13 adjacent to the second boundary BD2.

In another exemplary embodiment, the first standard cell SC1' may include cutting layers disposed on two or more conductive lines adjacent to the first boundary BD1 or cutting layers disposed on two or more conductive lines adjacent to the second boundary BD2. Therefore, a separation distance for insulation between two standard cells may be differently determined according to exemplary embodiments.

In addition, the second standard cell SC2' may include a cutting layer CT21 disposed on the conductive line CL22 adjacent to the first boundary BD1. Although not illustrated, in another exemplary embodiment, the second standard cell SC2' may include cutting layers disposed on the conductive lines CL21 and CL22 adjacent to the first boundary BD1.

In addition, the third standard cell SC3' may include a cutting layer CT31 disposed on the conductive line CL31 adjacent to the second boundary BD2. Although not illustrated, in another exemplary embodiment, the third standard cell SC3' may include cutting layers disposed on the conductive lines CL31 and CL32 adjacent to the second boundary BD2.

The first standard cell SC1' may include first contact patterns CA1a and CA1b disposed adjacent to the first boundary BD1 and first contact patterns CA1c and CA1d disposed adjacent to the secondary boundary BD2. The second standard cell SC2' may include second contact patterns CA2a and CA2b disposed adjacent to the first boundary BD1. The third standard cell SC3' may include third contact patterns CA3a and CA3b disposed adjacent to the secondary boundary BD2.

According to exemplary embodiments, after the process of placing the first to third standard cells SC1' to SC3', voltages may be compared with each other, the voltages being applied to the patterns disposed adjacent to each other in the second direction at both sides of the first boundary BD1. In particular, a voltage V1 applied to the first contact pattern CA1a may be compared with a voltage V2 applied to the second contact pattern CA2a. In addition, a voltage V3 applied to the first contact pattern CA1b may be compared with a voltage V4 applied to the second contact pattern CA2b.

As a result of the comparison, when the voltages V1 and V3 are respectively substantially the same as the voltages V2 and V4, the cutting layers CT11 and CT21 respectively disposed on the first conductive lines CL11 and CL22 may be removed. The voltages V1 and V3 are respectively applied to the first and second contact patterns CA1a and CA1b, and the voltages V2 and V4 are respectively applied to the second contact patterns CA2a and CA2b.

As described above, in the IC 165 in which the cutting layers CT11 and CT21 respectively disposed on the conductive lines CL11 and CL22 are removed, the conductive lines CL11 and CL22 may be used as real, or operational, conductive lines to implement a transistor. In particular, each of the conductive lines CL11 and CL22 may implement a gate electrode of the transistor.

The fins FN connected to the first contact pattern CA1a in a side of the conductive line CL11 may implement a source or a drain of the transistor. The fins FN connected to the second contact pattern CA2a in a side of the conductive line CL22 may implement a source or a drain of a transistor. In exemplary embodiments, the same power supply voltage may be applied to the first and second contact patterns CA1a and CA2a. Therefore, the fins FN respectively connected to the first and second contact patterns CA1a and CA2a and the conductive lines CL11 and CL22 may implement two transistors connected in series to each other, and the two transistors may correspond to a decoupling capacitor.

In addition, the fins FN connected to the first contact pattern CA1b in the side of the conductive line CL11 may implement a source or a drain of a transistor. The fins FN connected to the second contact pattern CA2b in the side of the conductive line CL22 may implement a source or a drain of a transistor. In exemplary embodiments, the same ground voltage may be applied to the first and second contact patterns CA1b and CA2b. As a result, the fins FN respectively connected to the first and second contact patterns CA1b and CA2b and the conductive lines CL11 and CL22 may implement two transistors connected in series to each other, and the two transistors may correspond to a decoupling capacitor.

According to exemplary embodiments, after the process of placing the first to third standard cells SC1' to SC3', voltages may be compared with each other, the voltages being applied to the patterns disposed adjacent to each other in the second direction at both sides of the second boundary BD2. In particular, a voltage V5 applied to the first contact pattern CA1c may be compared with a voltage V6 applied to the third contact pattern CA3a. In addition, a voltage V7 applied to the first contact pattern CA1d may be compared with a voltage V8 applied to the third contact pattern CA3b.

As a result of the comparison, when the voltages V5 and V7 are respectively substantially the same as the voltages V6 and V8, the cutting layers CT12 and CT31 respectively disposed on the first conductive lines CL13 and CL31 may be removed. The voltages V5 and V7 are respectively applied to the first contact patterns CA1c and CA1d, and the voltages V6 and V8 are respectively applied to the third contact patterns CA3a and CA3b. In such exemplary embodiments, the cutting layers CT12 and CT31 may be used as a double diffusion break.

Figure 17:
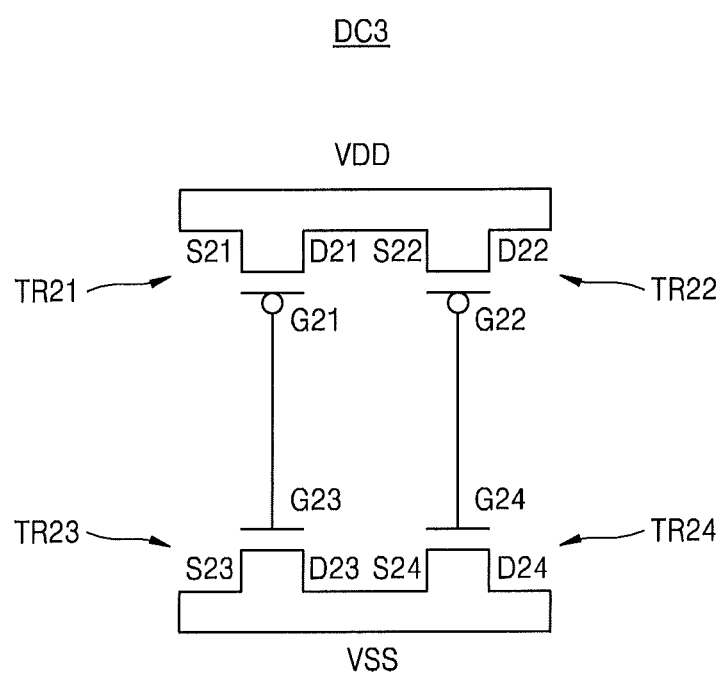
FIG. 17 is a circuit diagram of a decoupling capacitor of FIG. 16, according to an exemplary embodiment.

FIG. 17 is a circuit diagram of a decoupling capacitor DC3 of FIG. 16, according to an exemplary embodiment.

Referring to FIG. 17, the decoupling capacitor DC3 may include first to fourth transistors TR21 and TR24. The first and second transistors TR21 and TR22 may be connected to a power supply voltage terminal VDD. The third and fourth transistors TR23 and TR24 may be connected to a ground voltage terminal VSS.

The same power supply voltage terminal VDD may be connected to a first source S21 of the first transistor TR21 and a second drain D22 of the second transistor TR22. For example, the first source 21 may be first and second fins FN1 and FN2 connected to the second contact pattern CA2a in the IC 165 of FIG. 16. For example, the second drain D22 may be first and second fins FN1 and FN2 connected to the first contact pattern CA1a in the IC 165 of FIG. 16.

A first drain D21 of the first transistor T21 may be connected to a second source S22 of the second transistor TR22. For example, the first drain D21 and the second source S22 may be first and second fins FN1 and FN2 between the conductive line CL11 and the conductive line CL22 in the IC 165 of FIG. 16.

The ground voltage terminal VSS may be connected to a third source S23 of the third transistor TR23 and a fourth drain D24 of the fourth transistor TR24. For example, the third source S23 may be first and second fins FN1 and FN2 connected to the second contact pattern CA2b in the IC 165 of FIG. 16. For example, the fourth drain D24 may be first and second fins FN1 and FN2 connected to the first contact Ca1b in the IC 165 of FIG. 16. The third drain D23 of the third transistor T23 may be connected to the fourth source S24 of the fourth transistor TR24. For example, the third drain D23 and the fourth source S24 may be first and second fins FN1 and FN2 between the conductive line CL11 and the conductive line CL22 in the IC 165 of FIG. 16.

A first gate electrode G21 of the first transistor TR21 may be connected to a third gate electrode G23 of the third transistor TR23. The first and third gate electrodes G21 and G23 may be the conductive line CL22 included in the IC 165 of FIG. 16. In exemplary embodiments, a gate voltage may be applied to the conductive line CL22. A second gate electrode G22 of the second transistor TR22 may be connected to a fourth gate electrode G24 of the fourth transistor TR24. The second and fourth gate electrodes G22 and G24 may be the conductive line CL11 included in the IC 165 of FIG. 16. In exemplary embodiments, a gate voltage may be applied to the conductive line CL22.

Figure 18:
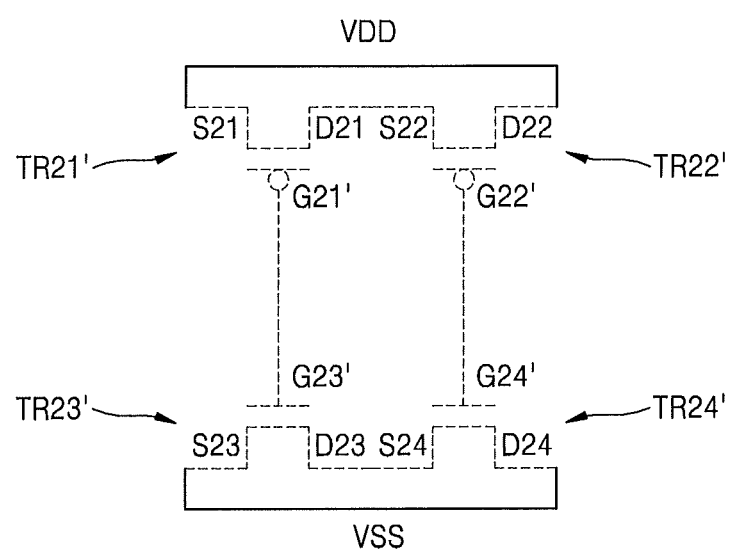
FIG. 18 is a circuit diagram of a decoupling capacitor of FIG. 16, according to another exemplary embodiment.

FIG. 18 is a circuit diagram of a decoupling capacitor DC4 of FIG. 16, according to another exemplary embodiment.

Referring to FIG. 18, the decoupling capacitor DC4 may include first to fourth transistors TR21' and TR24'. The first and second transistors TR21' and TR22' may be connected to a power supply voltage terminal VDD. The third and fourth transistors TR23' and TR24' may be connected to a ground voltage terminal VSS.

The same power supply voltage terminal VDD may be connected to a first source S21 of the first transistor TR21' and a second drain D22 of the second transistor TR22'. For example, the first source S21 may be first and second fins FN1 and FN2 connected to the second contact pattern CA2a in the IC 165 of FIG. 16. For example, the second drain D22 may be first and second fins FN1 and FN2 connected to the first contact pattern CA1a in the IC 165 of FIG. 16.

A first drain D21 of the first transistor T21' may be connected to a second source S22 of the second transistor TR22'. For example, the first drain D21 and the second source S22 may be first and second fins FN1 and FN2 between the conductive line CL11 and the conductive line CL22 in the IC 165 of FIG. 16.

The ground voltage terminal VSS may be connected to a third source S23 of the third transistor TR23' and a fourth drain D24 of the fourth transistor TR24'. For example, the third source S23 may be first and second fins FN1 and FN2 connected to the second contact pattern CA2b in the IC 165 of FIG. 16. For example, the fourth drain D24 may be first and second fins FN1 and FN2 connected to the first contact pattern CA1b in the IC 165 of FIG. 16.

A third drain D23 of the third transistor T23' may be connected to a fourth source S24 of the fourth transistor TR24'. For example, the third drain D23 and the fourth source S24 may be first and second fins FN1 and FN2 between the conductive line CL11 and the conductive CL22 in the IC 165 of FIG. 16.

A first gate electrode G21' of the first transistor TR21' may be connected to a third gate electrode G23' of the third transistor TR23'. The first and third gate electrodes G21' and G23' may be the conductive line CL22 included in the IC 165 of FIG. 16. A second gate electrode G22' of the second transistor TR22' may be connected to a fourth gate electrode G24' of the fourth transistor TR24'. The second and fourth gate electrodes G22' and G24' may be the conductive line CL11 included in the IC 165 of FIG. 16. In the present exemplary embodiment, a gate voltage may be applied to the conductive line CL11. In exemplary embodiments, the conductive lines CL11 and CL22 may float.

Figure 19:
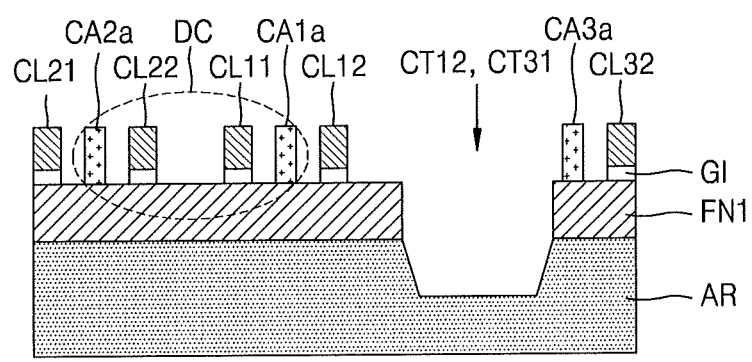
FIG. 19 is a cross-sectional view taken along line XIX-XIX' of the layout of FIG. 16, according to an exemplary embodiment.

FIG. 19 is a cross-sectional view taken along line XIX-XIX' of the layout of FIG. 16, according to an exemplary embodiment.

Referring to FIG. 19, a semiconductor device according to the layout of the IC 165 may be manufactured as illustrated in FIG. 19. Specifically, first fins FN1 may be disposed on an active region AR. Because cutting layers CT1 and CT2 are removed between a first standard cell SC1 and a second standard cell SC2 in the IC 165, the first fins FN1 may be disposed in the first and second standard cells SC1 and SC2 to be connected to each other. Because cutting layers CT12 and CT31 are maintained between the first standard cell SC1 and a third standard cell SC3 in the IC 165, the first fins FN1 may be cut between the first standard cell SC1 and the third standard cell SC3.

An insulating layer GI may be disposed on the first fins FN1. Conductive lines CL may be disposed on the insulating layer GI. In exemplary embodiments, the insulating layer GI may be a gate insulating layer and conductive lines CL may be gate electrodes. In addition, a second contact pattern CA2a, a first contact pattern CA1a, and a third contact pattern CA3a may be disposed on the first fins FN1. In exemplary embodiments, the same power supply voltage may be applied to the first and second contact patterns CA1a and CA2a, and the first fins FN1 connected to the first and second contact patterns CA1a and CA2a and the first conductive line CL1 between the first contact pattern CA1a and the second contact pattern CA2a may implement a transistor corresponding to a decoupling capacitor DC. Because the first fins FN may be separated between the first standard cell SC1 and the third standard cells SC3, the first standard cell SC1 may be electrically insulated from the third standard cell SC3.

Figure 20:
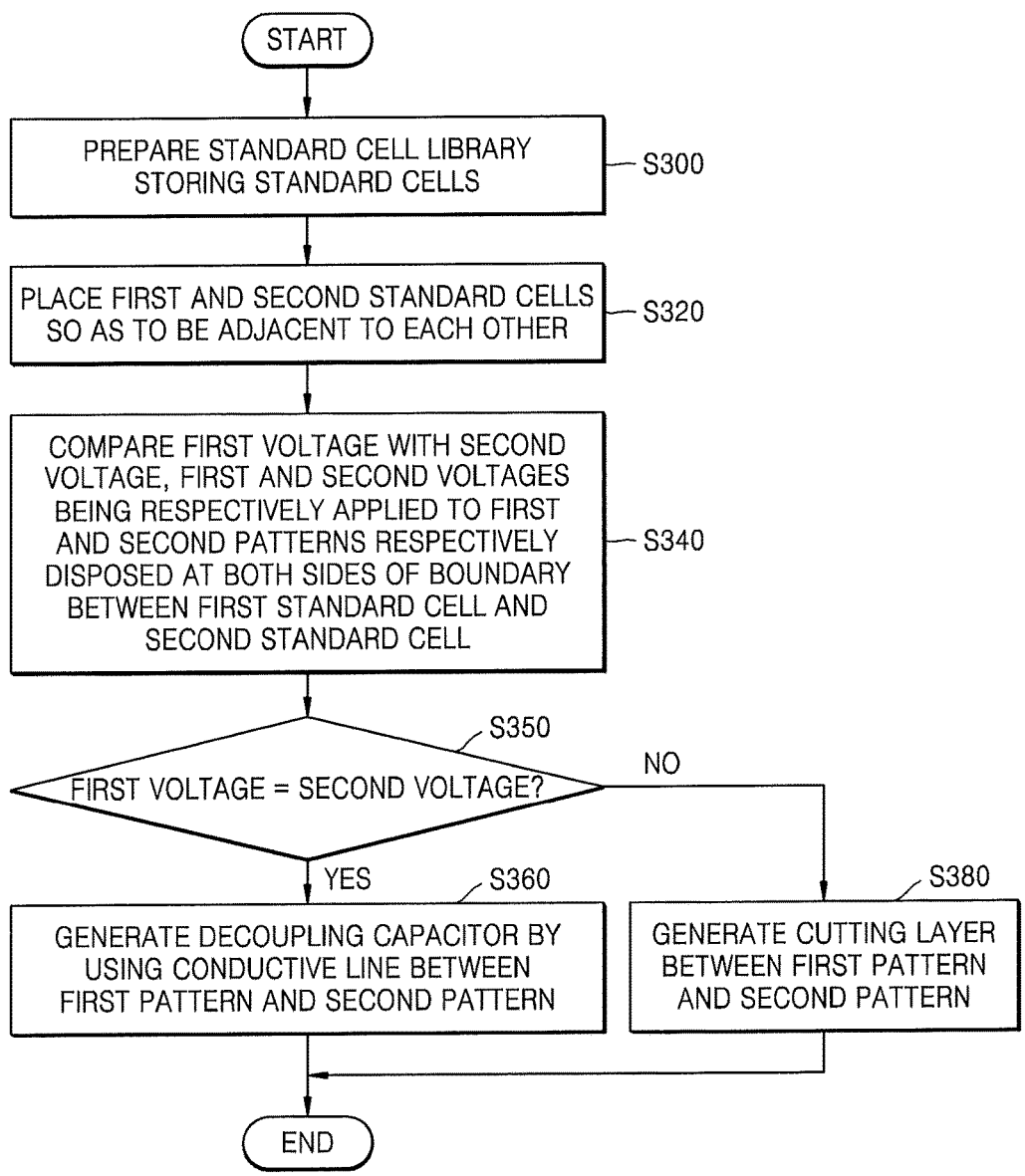
FIG. 20 is a flowchart of a method of designing an IC, according to another exemplary embodiment.

FIG. 20 is a flowchart of a method of designing an IC, according to another exemplary embodiment.

The method of FIG. 20 is a specific exemplary embodiment of the method of FIG. 1 and is a modification of the method of FIG. 4. The detailed description provided with reference to FIGS. 1 and 4 may also be applied to the exemplary embodiment of FIG. 20, and redundant descriptions thereof will not be repeated here. In operation S300, a standard cell library storing information about standard cells may be prepared. In exemplary embodiments, it is not necessary to store information about a cutting layer in the standard cell library. In operation S320, first and second standard cells may be placed adjacent to each other.

In operation S340, a first voltage may be compared with a second voltage. The first and second voltages are respectively applied to first and second patterns respectively disposed at both sides of a first boundary between the first standard cell and the second standard cell. In operation S350, it is determined whether the first voltage is substantially the same as the second voltage. As a result of the determination, when the first voltage is substantially the same as the second voltage, operation S360 may be performed. On the other hand, when the first voltage is not substantially the same as the second voltage, operation S380 may be performed.

In operation S360, a decoupling capacitor is generated by using a conductive line between the first pattern and the second pattern. In particular, the conductive line between the first pattern and the second pattern may be a real, or operational, conductive line, and the real conductive line may implement a transistor. In exemplary embodiments, when the first and second patterns are connected to a power supply voltage terminal or a ground voltage terminal, the transistor may operate as a decoupling capacitor.

In operation S380, a cutting layer may be generated between the first pattern and the second pattern. As a result, a diffusion break may be generated between the first pattern and the second pattern, and the first standard cell may be electrically insulated from the second standard cell.

Figure 21:
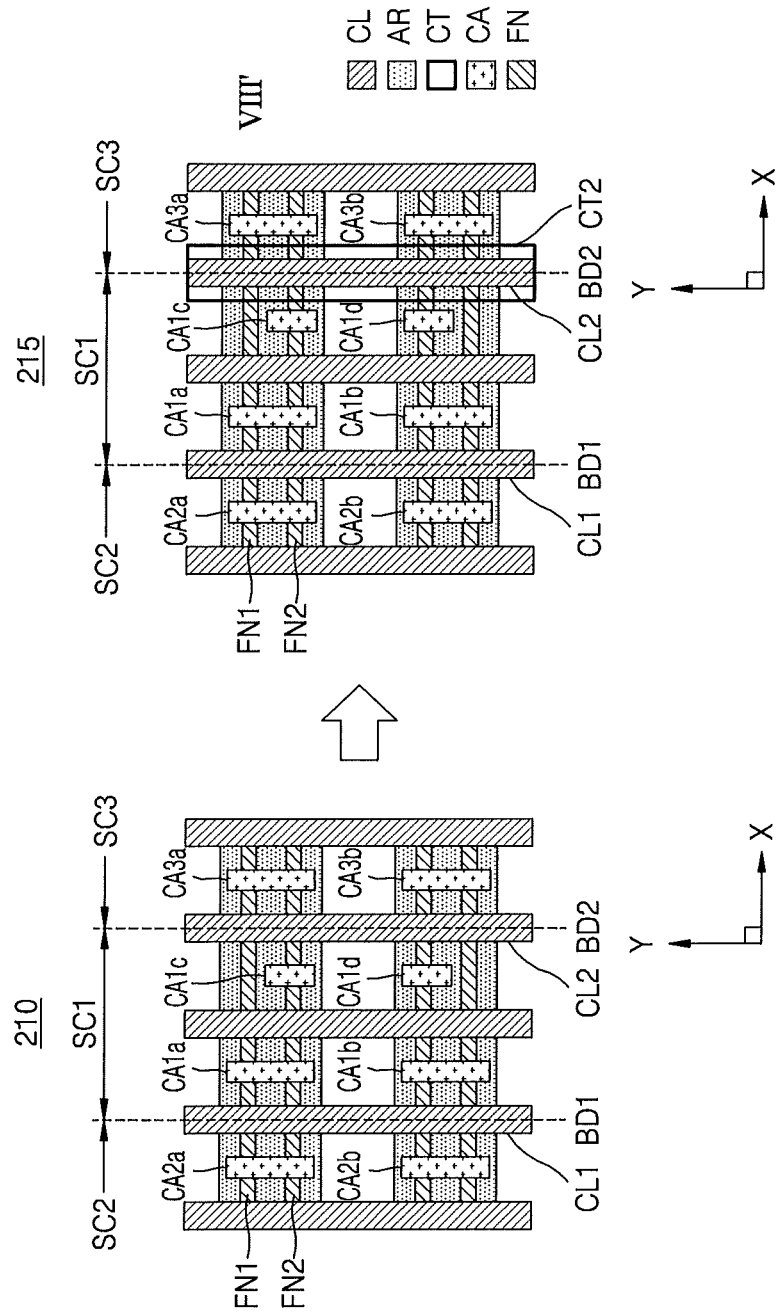
FIG. 21 is a layout to which the method of FIG. 20 is applied, according to an exemplary embodiment.

FIG. 21 is a layout to which the method of FIG. 20 is applied, according to an exemplary embodiment.

Referring to FIG. 21, an IC 210 may have a layout after operation S320 of FIG. 20 and may include first to third standard cells SC1 to SC3, which are placed adjacent to each other. The first and second standard cells SC1 and SC2 may be adjacent to each other in a first boundary BD1. The first and third standard cells SC1 and SC3 may be adjacent to each other in a second boundary BD2.

Each of the first to third standard cells SC1 to SC3 may include active regions AR continuously disposed in a second direction (for example, an X-direction). In exemplary embodiments, the active regions AR included in the first to third standard cells SC1 to SC3 may be connected to each other. In particular, active regions AR disposed adjacent to each other in the second direction may be connected to each other.

The first to third standard cells SC1 to SC3 may additionally include fins FN on the active regions AR. The fins FN may extend in the second direction and may be disposed in parallel to each other in a first direction (for example, a Y-direction) substantially perpendicular to the second direction. The fins FN on the active regions AR may be referred to as active fins. Although not illustrated, the fins FN may be disposed between the active regions AR. The fins FN between the active regions AR may be referred to as dummy fins.

Each of the first to third standard cells SC1 to SC3 may include a plurality of conductive lines CL extending in the first direction. In exemplary embodiments, the plurality of conductive lines CL may be disposed on a plurality of fins FN. In particular, the plurality of conductive lines CL may be disposed across the plurality of fins FN.

In exemplary embodiments, the first standard cell SC1 may include first contact patterns CA1a and CA1b disposed adjacent to the first boundary BD1 and first contact patterns CA1c and CA1d disposed adjacent to the second boundary BD2. The second standard cell SC2 may include second contact patterns CA2a and CA2b disposed adjacent to the first boundary BD1. The third standard cell SC3 may include third contact patterns CA3a and CA3b disposed adjacent to the second boundary BD2.

According to exemplary embodiments, after the process of disposing the first to third standard cells SC1 to SC3, voltages may be compared with each other, the voltages being applied to the patterns disposed adjacent to each other in the second direction at both sides of the first boundary BD1. In particular, a voltage V1 applied to the first contact pattern CA1a may be compared with a voltage V2 applied to the second contact pattern CA2a. In addition, a voltage V3 applied to the first contact pattern CA1b may be compared with a voltage V4 applied to the second contact pattern CA2b.

As a result of the comparison, when the voltages V1 and V3 are respectively substantially the same as the voltages V2 and V4, a decoupling capacitor may be generated by using a first conductive line CL1. The voltages V1 and V3 are respectively applied to the first contact patterns CA1a and CA1b, and the voltages V2 and V4 are respectively applied to the second contact patterns CA2a and CA2b. In exemplary embodiments, the first conductive line CL1 may be used as a real, or operational, conductive line to implement a transistor. In particular, the first conductive line CL1 may implement a gate electrode of the transistor.

Fins FN respectively connected to the first and second contact patterns CA1a and CA2a at both sides of the first conductive line CL1 may implement a source and a drain of the transistor. In exemplary embodiments, the same power supply voltage may be applied to the first and second contact patterns CA1a and CA2a. Accordingly, the transistor may include the fins FN respectively connected to the first and second contact patterns CA1a and CA2a and the first conductive line CL1 and may correspond to a decoupling capacitor.

In addition, fins FN respectively connected to the first and second contact patterns CA1b and CA2b at both sides of the first conductive lines CL1 may implement a source and a drain of a transistor. In exemplary embodiments, the same ground voltage may be applied to the first and second contact patterns CA1b and CA2b. Accordingly, the transistor may include the fins FN respectively connected to the first and second contact patterns CA1b and CA2b and the first conductive line CL1 and may correspond to the decoupling capacitor.

According to exemplary embodiments, after the process of disposing the first to third standard cells SC1 to SC3, voltages may be compared to each other, the voltages being applied to the patterns disposed adjacent to each other in the second direction at both sides of the second boundary BD2. In particular, a voltage V5 applied to the first contact pattern CA1c may be compared with a voltage V6 applied to the third contact pattern CA3a. In addition, a voltage V7 applied to the first contact pattern CA1d may be compared with a voltage V8 applied to the third contact pattern CA3b.

As a result of the comparison, when the voltage V5 and V7 respectively differ from the voltages V6 and V8, a cutting layer may be generated on a second conductive line CL2. The voltages V5 and V7 are respectively applied to the first contact patterns CA1c and CA1d, and the voltages V6 and V8 are respectively applied to the third contact patterns CA3a and CA3b. In exemplary embodiments, the cutting layer CT may be used as a single diffusion break.

Figure 22:
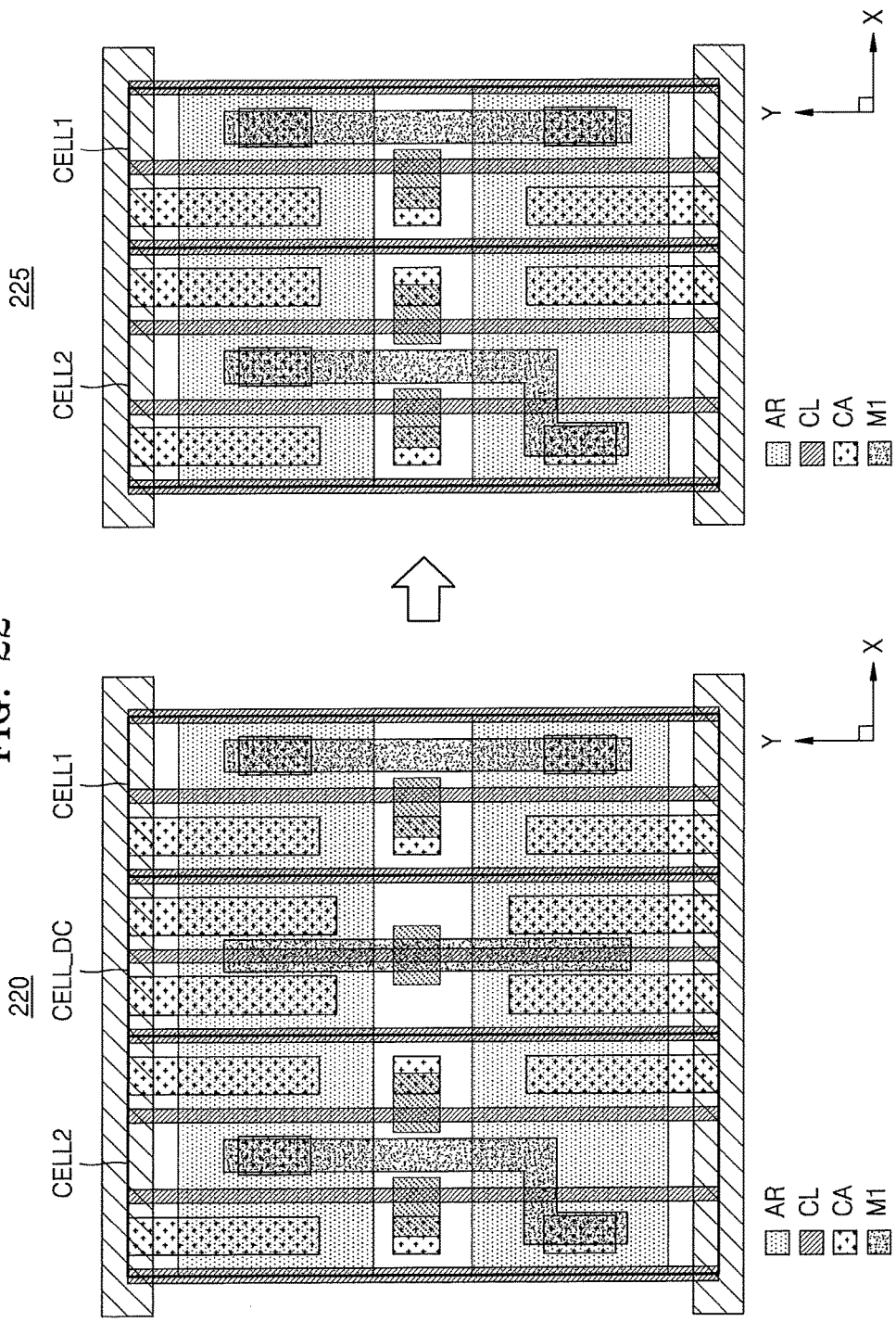
FIG. 22 is a layout for describing a reduction in an area of the IC when the method of designing the IC according to the exemplary embodiment is applied.

FIG. 22 is a layout describing a reduction in an area of an IC to which a method of designing the IC is applied, according to an exemplary embodiment.

Referring to FIG. 22, an IC 220 may include a second cell CELL2, a decoupling capacitor cell CELL-D, and a first cell CELL1, which are placed adjacent to each other. The first and second cells CELL1 and CELL2 may be substantially implemented similarly to the first and second sells CELL1 and CELL2 of FIG. 13, respectively, and detailed descriptions thereof will not be repeated here.

As described above, in order to reduce voltage noise according to a change in power supply voltage, the IC 220 may dispose the decoupling capacitor cell CELL-DC between the first cell CELL1 and the second cell CELL2. Therefore, a total area of the IC 220 may increase.

According to exemplary embodiments, in an IC 225, a decoupling capacitor DC may be generated between a first cell CELL1 and a second cell CELL2. As a result, the total area of the IC 225 may not increase, yet voltage noise according to a change in power supply voltage may be reduced. The detailed description provided with reference to FIG. 14 may also be applied to the decoupling capacitor DC generated between the first cell CELL1 and the second cell CELL2, and redundant descriptions thereof will not be repeated here.

Figure 23:
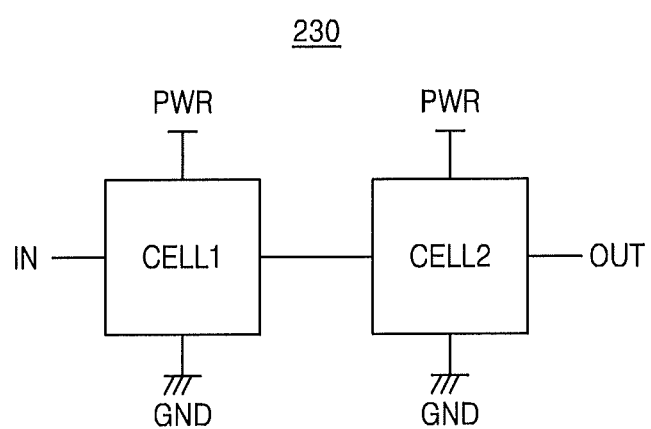
FIG. 23 is a diagram of an IC not including a decoupling capacitor, according to an exemplary embodiment.

FIG. 23 is a diagram of an IC 230 not including a decoupling capacitor, according to an exemplary embodiment.

Referring to FIG. 23, the IC 230 may include first and second cells CELL1 and CELL2 that are placed adjacent to each other. An input signal IN with respect to The IC 230 may be inputted in the first cell CELL1. An output signal OUT generated in the IC 230 may be outputted from the second cell CELL2. In exemplary embodiments, each of the first and second cells CELL1 and CELL2 may be connected to a power supply voltage terminal PWR and a ground voltage terminal GND.

Figure 24:
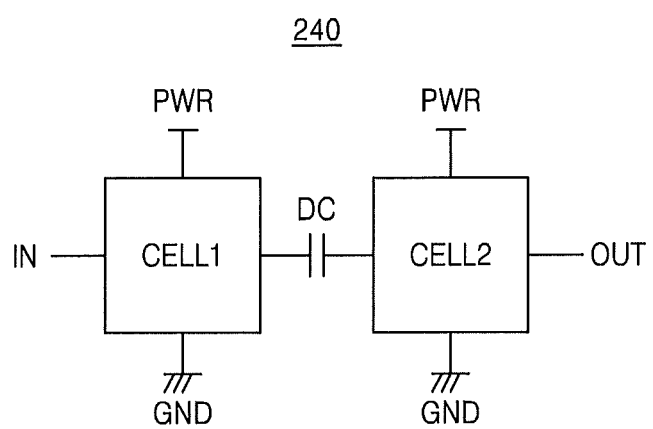
FIG. 24 is a diagram of an IC including a decoupling capacitor, according to an exemplary embodiment.

FIG. 24 is a diagram of an IC 240 including a decoupling capacitor, according to an exemplary embodiment.

Referring to FIG. 24, the IC 240 adds a decoupling capacitor DC generated according to an exemplary embodiment to the IC 230 of FIG. 23. In particular, the IC 240 may include first and second cells CELL1 and CELL2 and the decoupling capacitor DC between the first cell CELL1 and the second cell CELL2.

According to exemplary embodiments, as described in the IC IC2 of FIG. 14, the decoupling capacitor DC may be generated between the first cell CELL1 and the second cell CELL2. In this manner, in exemplary embodiments in accordance with principles of inventive concepts an IC such as the IC 240 may include the decoupling capacitor DC without an increase in total area when compared to an embodiment such as IC 230 of FIG. 23.

Figure 25:
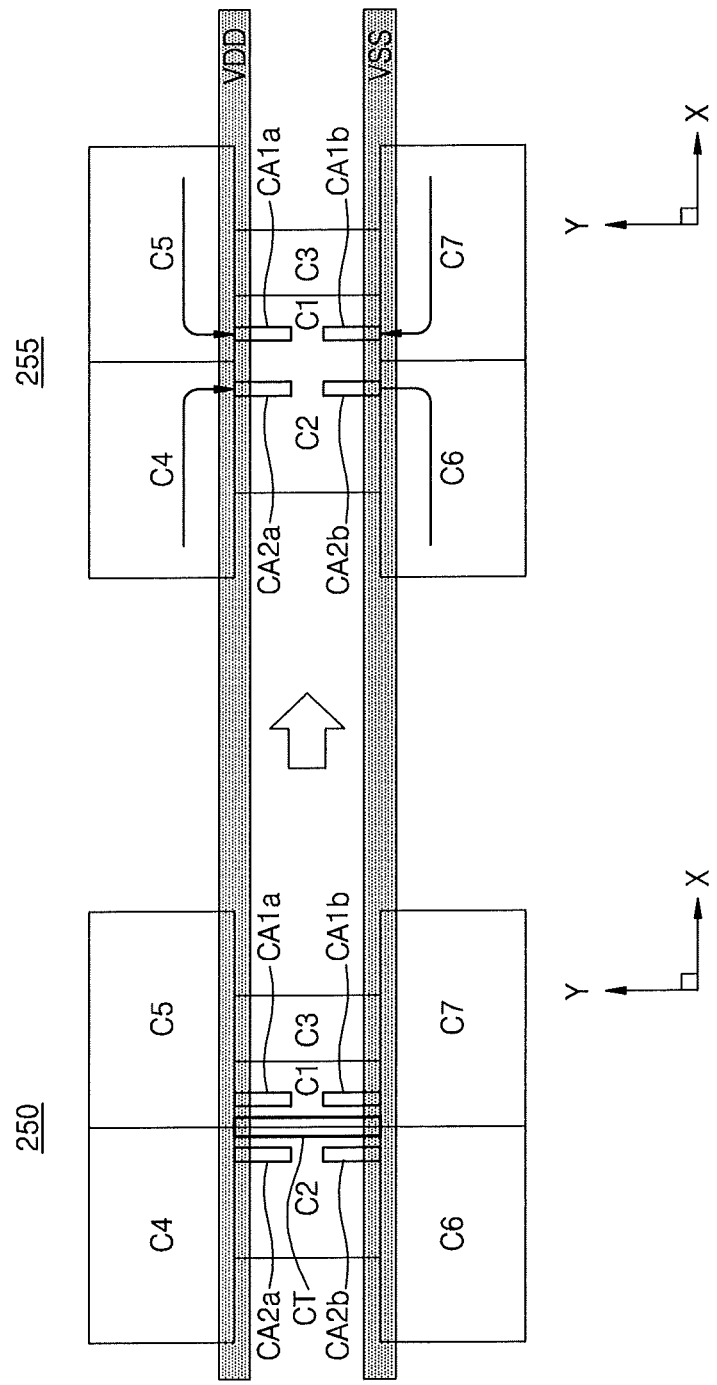
FIG. 25 is a diagram for describing a reduction in voltage noise when the method of designing the IC according to the exemplary embodiment s applied.

FIG. 25 is a diagram for describing a reduction in voltage noise when an area of an IC to which a method of designing a layout of the IC is applied, according to exemplary embodiments.

Referring to FIG. 25 an IC 250 may include a plurality of cells C1 to C7. A cutting layer CT may be disposed between the first cell C1 and the second cell C2 to insulate the first cell C1 from the second cell C2. The cutting layer CT is illustrated only between the first cell C1 and the second cell C2. The illustration is provided for convenience in description, but the cutting layer may also be disposed between the first cell C1 and the third cell C3, the fourth cell C4 and the fifth cell C5, or the sixth cell C6 and the seventh cell C7, for example.

According to an exemplary embodiment, when the same voltage is applied to first and second patterns respectively disposed at both sides of a boundary between the first cell C1 and the second cell C2, it is not necessary to dispose a cutting layer CT between the first cell C1 and the second cell C2, and, according to principles of inventive concepts, a transistor corresponding to a decoupling capacitor may be generated by using the first and second patterns.

In particular, in exemplary embodiments in accordance with principles of inventive concepts, a transistor corresponding to the decoupling capacitor may be generated by using first and second patterns CA1$a$ and CA2$a$ connected to a power supply voltage terminal VDD and a conductive line between the first pattern CA1$a$ and the second pattern CA2$a$, and a transistor corresponding to the decoupling capacitor may be generated by using first and second patterns CA1$b$ and CA2$b$ connected to a ground voltage terminal VSS and a conductive line between the first pattern CA1$b$ and the second pattern CA2$b$. As a result, voltage noise caused by a change in voltage may be reduced. In particular, transistors corresponding to the decoupling capacitor may be connected to the power supply voltage terminal VDD and the ground voltage terminal VSS to reduce an increase/decrease in dynamic voltage.

Figure 26:
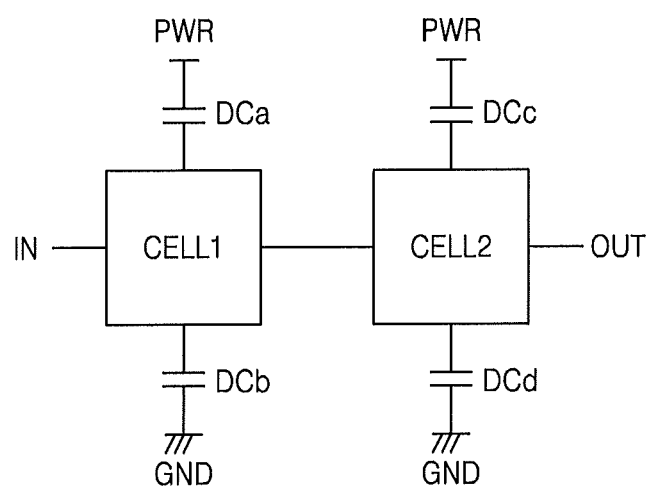
FIG. 26 is a diagram for describing a reduction in voltage noise by a decoupling capacity, according to an exemplary embodiment.

FIG. 26 is a diagram for describing a reduction in voltage noise by a decoupling capacitor, according to an exemplary embodiment.

Referring to FIG. 26, an IC 260 may include a first decoupling capacitor DCa generated between a first cell CELL1 and a power supply voltage terminal PWR, a second decoupling capacitor DCb generated between the first cell CELL1 and a ground voltage terminal GND, a third decoupling capacitor DCc generated between a second cell CELL2 and the power supply voltage terminal PWR, and a fourth decoupling capacitor DCd generated between the second cell CELL2 and the ground voltage terminal GND. In exemplary embodiments in accordance with principles of inventive concepts, the first to fourth decoupling capacitors DCa, DCb, DCc, and DCd may be generated by a decoupling capacitor generated by using a conductive line between the first cell CELL1 and the second cell CELL2.

Figure 27:
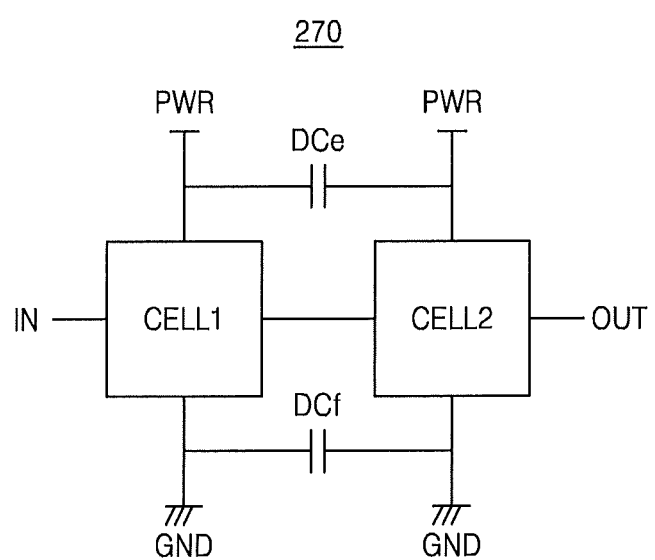
FIG. 27 is a diagram for describing a reduction in voltage noise by a decoupling capacity, according to another exemplary embodiment.

FIG. 27 is a diagram for describing a reduction in voltage noise by a decoupling capacitor, according to another exemplary embodiment.

Referring to FIG. 27, an IC 270 may include a fifth decoupling capacitor DCe generated between a node between a first cell CELL1 and a power supply voltage terminal PWR and a node between a second cell CELL2 and the power supply voltage terminal PWR, and a sixth decoupling capacitor DCf generated between a node between the first cell CELL1 and a ground voltage terminal GND and a node between the second cell CELL2 and the ground voltage terminal GND. The fifth and sixth decoupling capacitors DCe and DCf may be generated by a decoupling capacitor generated by using a conductive line between the first cell CELL1 and a second cell CELL2, in accordance with principles of inventive concepts.

Figure 28:
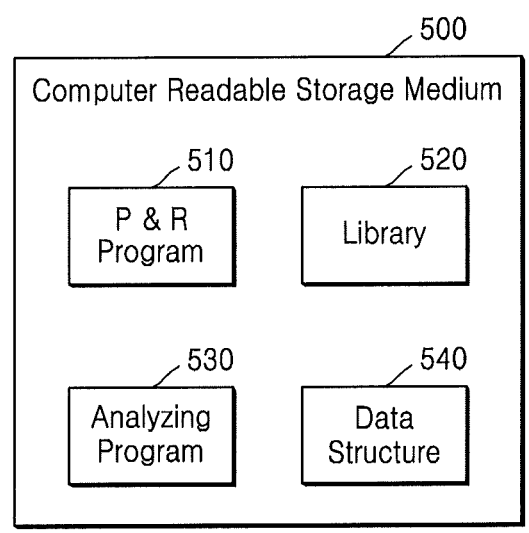
FIG. 28 is a block diagram for describing a storage medium according to an exemplary embodiment.

FIG. 28 is a block diagram for describing a storage medium 500 according to an exemplary embodiment.

Referring to FIG. 28, the storage medium 500 may include any non-transitory computer-readable storage medium used to provide commands and/or data to a computer as a non-transitory computer-readable storage medium. For example, the non-transitory computer-readable storage medium 500 may include a magnetic or optical medium such as a disc, a tape, or a CD-ROM, a DVD-ROM, a CD-R, a CD-RW, a DVD-R, or a DVD-RW, a volatile or non-volatile memory such as a RAM, a ROM, or a flash memory, an non-volatile memory accessible through an USB interface, and microelectromechanical systems (MEMS). The non-transitory computer-readable storage medium 500 may be inserted into the computer, may be integrated in the computer, or may be coupled to the computer through a communication medium such as a network and/or a wireless link.

As illustrated in FIG. 28, the non-transitory computer-readable storage medium 500 may include a placement and wiring program 510, a library 520, an analysis program 530, and a data structure 540. The placement and wiring program 510 may include a plurality of commands in order to perform a method of designing an IC by using a standard cell library in accordance with principles of inventive concepts. For example, the non-transitory computer-readable storage medium 500 may store the placement and wiring program 510 including any commands for designing the layout of the IC by using the standard cell library including a standard cell illustrated in at least one of the preceding drawings. The library 520 may include information about the standard cell that is a unit included in the IC.

The analysis program 530 may include a plurality of commands that perform a method of analyzing the IC based on data for defining the IC. The data structure 540 may include a storage space for using the standard cell library included in the library 520, extracting specific information from the general standard cell library included in the library 520, or managing data generated while characteristics of the IC are analyzed by the analysis program 530.

Figure 29:
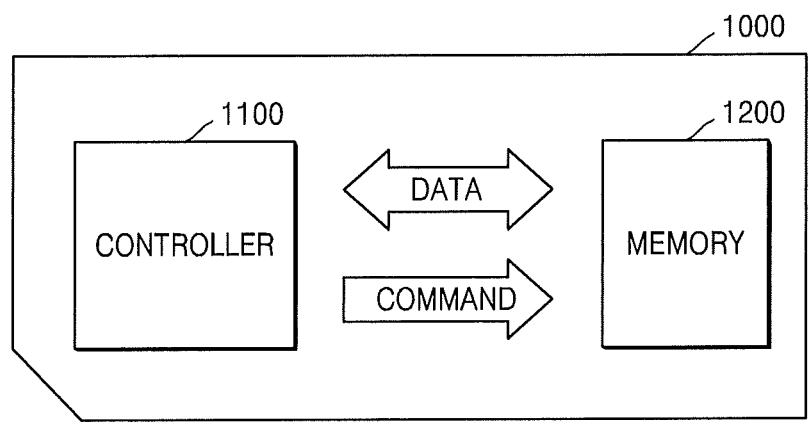
FIG. 29 is a block diagram for describing a memory card including an IC, according to an exemplary embodiment.

FIG. 29 is a block diagram for describing a memory card 1000 including an IC in accordance with principles of inventive concepts.

Referring to FIG. 29, the memory card 1000 may be disposed such that a controller 1100 exchanges an electric signal with a memory 1200. For example, when the controller 1100 issues a command, the memory 1200 may transmit data.

The controller 1100 and the memory 1200 may include ICs in accordance with principles of inventive concepts. In particular, at least one of a plurality of semiconductor devices included in the controller 1100 and the memory 1200 may be manufactured in accordance with principles of inventive concepts, using, for example, an exemplary embodiment described in detail with reference to FIGS. 1 to 28. That is, in at least one of the plurality of semiconductor devices included in the controller 1100 and the memory 1200, a decoupling capacitor may be generated by using a conductive line between adjacent two cells in accordance with principles of inventive concepts. Accordingly, power supply voltage noise may be reduced without an increase in an area due to the addition of a decoupling capacitor cell.

The memory card 1000 may implement various cards, for example, various memory cards such as a memory stick card, a smart media (SM) card, a secure digital (SD) card, a mini-secure digital card (mini-SD), and a multimedia card (MMC).

Figure 30:
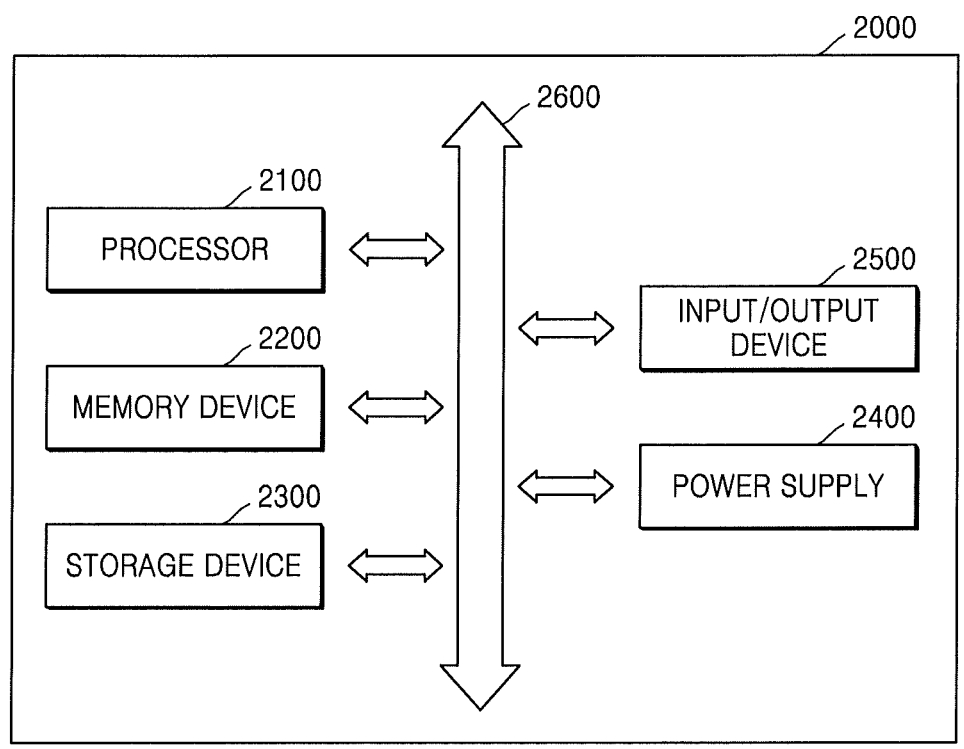
FIG. 30 is a block diagram for describing a computing system including an IC, according to an exemplary embodiment.

FIG. 30 is a block diagram for describing a computing system 2000 including an IC in accordance with principles of inventive concepts.

Referring to FIG. 30, the computing system 2000 may include a processor 2100, a memory device 2200, a storage device 2300, and a power supply 2400, and an input/output device 2500. Although not illustrated in FIG. 30, the computing system 2000 may further include ports communicating with a video card, a sound card, a memory card, a USB device, or other electronic devices.

As described above, the processor 2100, the memory device 2200, the storage device 2300, and the power supply 2400, and the input/output device 2500 in the computing system 2000 may include ICs in accordance with principles of inventive concepts. In particular, in at least one of the plurality of semiconductor devices included in the processor 2100, the memory device 2200, the storage device 2300, the power supply 2400, and the input/output device 2500, a decoupling capacitor may be generated by using a conductive line between adjacent two cells. Accordingly, power supply voltage noise may be reduced without an increase in an area due to the addition of a decoupling capacitor cell.

The processor 2100 may perform specific calculations or tasks. According to exemplary embodiments, the processor 2100 may be a micro-processor or a central processing unit (CPU). The processor 2100 may perform communication with the memory device 2200, the storage device 2300, and the input/output device 2500 through a bus 2600 such as an address bus, a control bus, or a data bus. According to exemplary embodiments, the processor 2100 may also be connected to an expansion bus such as a peripheral component interconnect (PCI) bus.

The memory device 2200 may store data necessary for operating the computing system 2000. For example, the memory device 2200 may be implemented as a DRAM), a mobile DRAM, an SRAM, a PRAM, an FRAM, an RRAM, and/or an MRAM. The storage device 2300 may include a solid state drive, a hard disk drive, a CD-ROM, or the like.

The input/output device 2500 may include an input unit such as a keyboard, a keypad, or a mouse and an output unit such as a printer, or a display. The power supply 2400 may provide an operation voltage necessary for operating the computing system 2000.

ICs in accordance with principles of inventive concepts, such as those according to exemplary embodiment described above may be implemented as packages having various shapes. For example, at least a compartment of the IC may be mounted by using packages such as a package on package (POP), ball grid arrays (BGAs), chip scale packages (CSPs), a plastic leaded chip carrier (PLCC), a plastic dual in-line package (PDIP), a die in waffle pack, a die in wafer form, a chip on board (COB), a ceramic dual in-line package (CERDIP), a plastic metric quad flat pack (MQFP), a thin quad flatpack (TQFP), a small outline integrated circuit (SOIC), a shrink small outline package (SSOP), a thin small outline (TSOP), a system in package (SIP), a multi chip package (MCP), a wafer-level fabricated package (WFP), and a wafer-level processed stack package (WSP).

While inventive concepts has been particularly shown and described with reference to exemplary embodiments thereof, it will be understood that various changes in form and details may be made therein without departing from the spirit and scope of inventive concepts. Therefore, the scope of inventive concepts is to be determined by the broadest permissible interpretation of the following claims and their equivalents, and shall not be restricted or limited by the foregoing description.

What is claimed is:

1. A method of designing a layout of an integrated circuit (IC) in an electronic processor, the method comprising:
preparing, using a processor, a standard cell library that stores a first standard cell and a second standard cell, each of the first standard cell and the second standard cell including a plurality of conductive lines that extend in a first direction;
placing, using the processor, the first standard cell and the second standard cell to be adjacent to each other at a first boundary parallel to the plurality of conductive lines; and
generating, using the processor, a decoupling capacitor by using at least one first conductive line of the plurality of conductive lines when a same voltage is to be applied to a first conductive pattern adjacent to the first boundary in the first standard cell and to a second conductive pattern adjacent to the first boundary in the second standard cell, wherein the at least one first conductive line being adjacent to the first boundary.

2. The method of claim 1, wherein the at least one first conductive line is disposed on the first boundary.

3. The method of claim 1, further comprising insulating the first standard cell from the second standard cell by using the at least one first conductive line as a dummy line when different voltages are to be applied to the first conductive pattern and the second conductive pattern.

4. The method of claim 1, wherein at least one of the first standard cell and the second standard cell includes a cutting layer disposed on the first boundary, the cutting layer being configured to insulate the first standard cell from the second standard cell; and the generating of a decoupling capacitor further comprises removing the cutting layer between the first pattern and the second pattern to generate the decoupling capacitor when the same voltage is to be applied to the first pattern and the second pattern.

5. The method of claim 4, wherein the first standard cell further includes first fins that extend in a second direction substantially perpendicular to the first direction; the second standard cell further includes second fins that extend in the second direction; and the cutting layer is disposed to insulate the first fins included in the first standard cell from the second fins included in the second standard cell.

6. The method of claim 5, wherein the first pattern is a first contact pattern disposed on some of the first fins; the second pattern is a second contact pattern disposed on some of the second fins; and a first contact fin of the first fins, a second contact fin of the second fins, and the at least one first conductive line implement a transistor corresponding to the decoupling capacitor, the first contact fins and the second contact fins being respectively connected to the first contact pattern and the second contact pattern.

7. The method of claim 4, further comprising maintaining the cutting layer between the first pattern and the second pattern such that the first conductive line becomes a dummy line when different voltages are to be applied to the first pattern and the second pattern.

8. The method of claim 4, wherein the at least one of the first standard cell and the second standard cell further includes an additive cutting layer disposed on a second boundary opposite to the first boundary.

9. The method of claim 1, further comprising generating a cutting layer between the first pattern and the second pattern after the placing of the first standard cell and the second standard cell when different voltages are to be applied to the first pattern and the second pattern, the cutting layer being configured to insulate the first standard cell from the second standard cell.

10. The method of claim 9, wherein the first standard cell further includes first fins that extend in a second direction substantially perpendicular to the first direction; the second standard cell further includes second fins that extend in the second direction; and the cutting layer is disposed to insulate the first fins included in the first standard cell from the second fins included in the second standard cell.

11. The method of claim 10, wherein the first pattern is a first contact pattern disposed on some of the first fins; the second pattern is a second contact pattern disposed on some of the second fins; and a first contact fin of the first fins, a second contact fin of the second fins, and the at least one first conductive line implement a transistor corresponding to the decoupling capacitor, the first contact fin and second contact fin being respectively connected to the first contact pattern and the second contact pattern.

12. The method of claim 9, further comprising generating an additive cutting layer disposed on a second boundary opposite to the first boundary with respect to at least one of the first pattern and the second pattern after the placing of the first standard cell and the second standard cell.

13. The method of claim 1, wherein the same voltage applied to the first pattern and the second pattern is a power supply voltage or a ground voltage.

14. The method of claim 1, wherein the plurality of conductive lines correspond to a plurality of gate electrodes.

15. The method of claim 1, further comprising designing the IC such that the first conductive line floats.

16. A method of designing an integrated circuit using a design tool that includes a processor, the method comprising:
    selecting, using the processor, a first standard cell and a second standard cell from a standard cell library and placing them adjacent to each other, wherein the first standard cell and the second standard cell include conductive lines adjacent to and parallel to a boundary formed between these two standard cells by their adjacent placement and conductive contact patterns parallel to the boundary;
    determining, using the processor, whether a same voltage is to be applied to conductive contact patterns in each standard cell according to a design of the integrated circuit; and
    forming, using the processor, a decoupling capacitor by using the conductive lines when a same voltage is to be applied to the conductive contact patterns in each standard cell.

17. The method of claim 16, wherein the processor designs the conductive contact patterns to be connected to a power supply voltage.

18. The method of claim 16, wherein the processor designs the conductive contact patterns to be connected to a ground.

* * * * *